United States Patent
Nishimura

(10) Patent No.: US 9,445,489 B2
(45) Date of Patent: Sep. 13, 2016

(54) ELECTRONIC CONTROL UNIT AND ELECTRIC POWER STEERING APPARATUS HAVING THE SAME

(71) Applicant: DENSO CORPORATION, Kariya, Aichi-pref. (JP)

(72) Inventor: Toshiro Nishimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 70 days.

(21) Appl. No.: 14/582,465

(22) Filed: Dec. 24, 2014

(65) Prior Publication Data

US 2015/0183456 A1 Jul. 2, 2015

(30) Foreign Application Priority Data

Dec. 26, 2013 (JP) ................. 2013-269430

(51) Int. Cl.
| | |
|---|---|
| *H02P 1/00* | (2006.01) |
| *H05K 7/04* | (2006.01) |
| *H05K 1/02* | (2006.01) |
| *H05K 7/14* | (2006.01) |

(52) U.S. Cl.
CPC .......... *H05K 1/0203* (2013.01); *H05K 1/0209* (2013.01); *H05K 7/1432* (2013.01); *H05K 1/0224* (2013.01); *H05K 1/0231* (2013.01); *H05K 1/0234* (2013.01)

(58) Field of Classification Search
CPC ............... H05K 1/141; H05K 1/0215; H05K 7/20436; Y10T 29/49002; Y10T 29/49124; H04R 1/02
USPC ......................................................... 318/139
See application file for complete search history.

(56) References Cited

U.S. PATENT DOCUMENTS

| 7,550,826 | B2 * | 6/2009 | Orth ..................... H05K 1/0218 |
| | | | 257/659 |
| 2003/0002205 | A1 * | 1/2003 | Shibata .................. G11B 33/14 |
| | | | 360/99.15 |
| 2012/0057318 | A1 * | 3/2012 | Oota .................. H05K 7/20854 |
| | | | 361/753 |

FOREIGN PATENT DOCUMENTS

| JP | 02-058366 | 4/1990 |
| JP | 2000-091884 | 3/2000 |
| JP | 2005-184883 | 7/2005 |
| JP | 2012-079834 | 4/2012 |

OTHER PUBLICATIONS

Shibata, U.S. Appl. No. 14/582,529, filed Dec. 24, 2014.
(Continued)

*Primary Examiner* — Eduardo Colon Santana
*Assistant Examiner* — Gabriel Agared
(74) *Attorney, Agent, or Firm* — Nixon & Vanderhye PC

(57) ABSTRACT

An electronic control unit includes a board, an electronic device, a heatsink, and a fastener. The board includes a protection layer and a ground pattern covered with the protection layer. The ground pattern has an exposed portion exposed outside the protection layer. The electronic device is mounted on the board and has an anode terminal and a cathode terminal connected to the ground pattern. The heatsink supports the board. The fastener is inserted though an insertion hole of the exposed portion. The fastener electrically connects the ground pattern to the heatsink and fixes the board to the heatsink. The exposed portion is located on the cathode terminal side of the electronic device.

13 Claims, 16 Drawing Sheets

(56) References Cited

OTHER PUBLICATIONS

Nishimoto et al., U.S. Appl. No. 14/582,898, filed Dec. 24, 2014.
Tashima et al., U.S. Appl. No. 14/582,877, filed Dec. 24, 2014.

Office Action (2 pages) dated Feb. 23, 2016, issued in corresponding Japanese Application No. 2013-269430 and English translation (2 pages).
Tashima et al., U.S. Appl. No. 14/582,877, filed Dec. 24, 2014.

* cited by examiner ns,489 B2

ELECTRONIC CONTROL UNIT AND ELECTRIC POWER STEERING APPARATUS HAVING THE SAME

CROSS REFERENCE TO RELATED APPLICATION

This application is based on and claims priority to Japanese Patent Application No. 2013-269430 filed on Dec. 26, 2013, the contents of which are incorporated herein by reference.

FIELD

The present disclosure relates to an electronic control unit and an electric power steering apparatus having the electronic control unit.

BACKGROUND

A heat-dissipating structure in which heat generated from an electronic device is dissipated to another member such as a heatsink is known. For example, in JP-A-2012-79834, a multilayer board is fixed to a heat-dissipating plate by a screw or the like, and heat is dissipated through an insulating layer.

In JP-A-2012-79834, since the insulating layer is placed between the screw and the heat-dissipating plate, heat dissipation efficiency is not good. Further, JP-A-2012-79834 does not consider grounding the electronic device mounted on the board.

SUMMARY

In view of the above, it is an object of the present disclosure to provide an electronic control unit configured so that noise from an electronic device can be reduced and so that heat from the electronic device can be efficiently dissipated, and it is another object of the present disclosure is to provide an electric power steering apparatus having the electronic control unit.

According to an aspect of the present disclosure, an electronic control unit includes a board, an electronic device, a heatsink, and a fastener. The board includes a protection layer and a ground pattern covered with the protection layer. The ground pattern has an exposed portion exposed outside the protection layer. The electronic device is mounted on the board and has an anode terminal and a cathode terminal connected to the ground pattern. The heatsink supports the board. The fastener is inserted though an insertion hole of the exposed portion. The fastener electrically connects the ground pattern to the heatsink and fixes the board to the heatsink. The exposed portion is located on the cathode terminal side of the electronic device.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Embodiments of the present disclosure are described below with reference to the drawings in which like characters of reference indicate the same or equivalent parts.

(First Embodiment)

Figure 1:
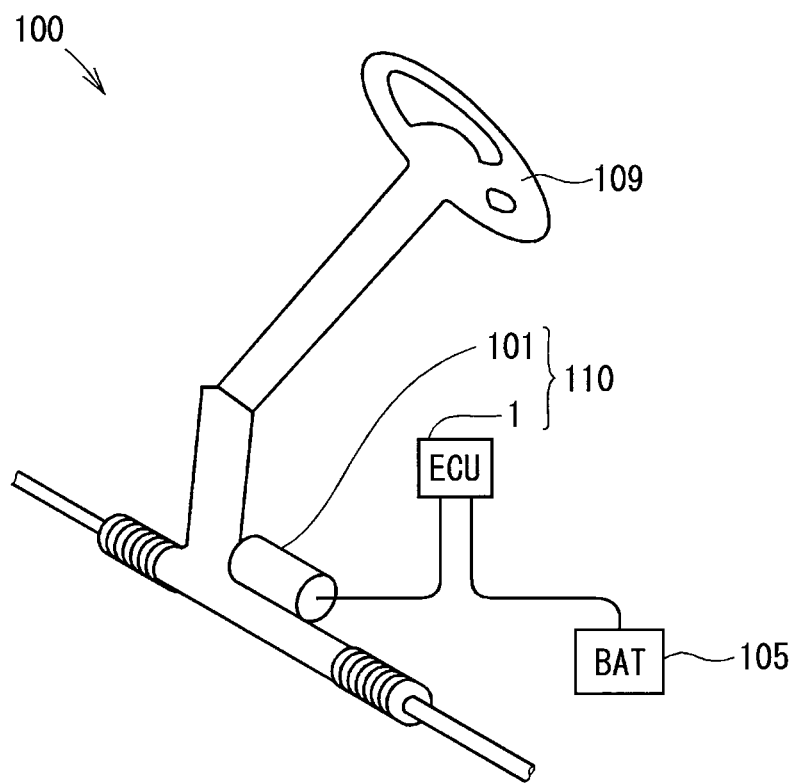
FIG. 1 is a diagram illustrating a structure of an electric power steering apparatus according to a first embodiment of the present disclosure.

As shown in FIG. 1, an electronic control unit 1 according to a first embodiment of the present disclosure is used in an electric power steering apparatus 100 of a vehicle. The electronic control unit 1 drives and controls a motor 101 as a rotating electrical machine based on a steering torque signal and a vehicle speed signal so that the motor 101 can produce assisting-torque to help a driver to steer the vehicle. An electronic power steering apparatus 110 includes the electronic control unit 1 and the motor 101.

Figure 2:
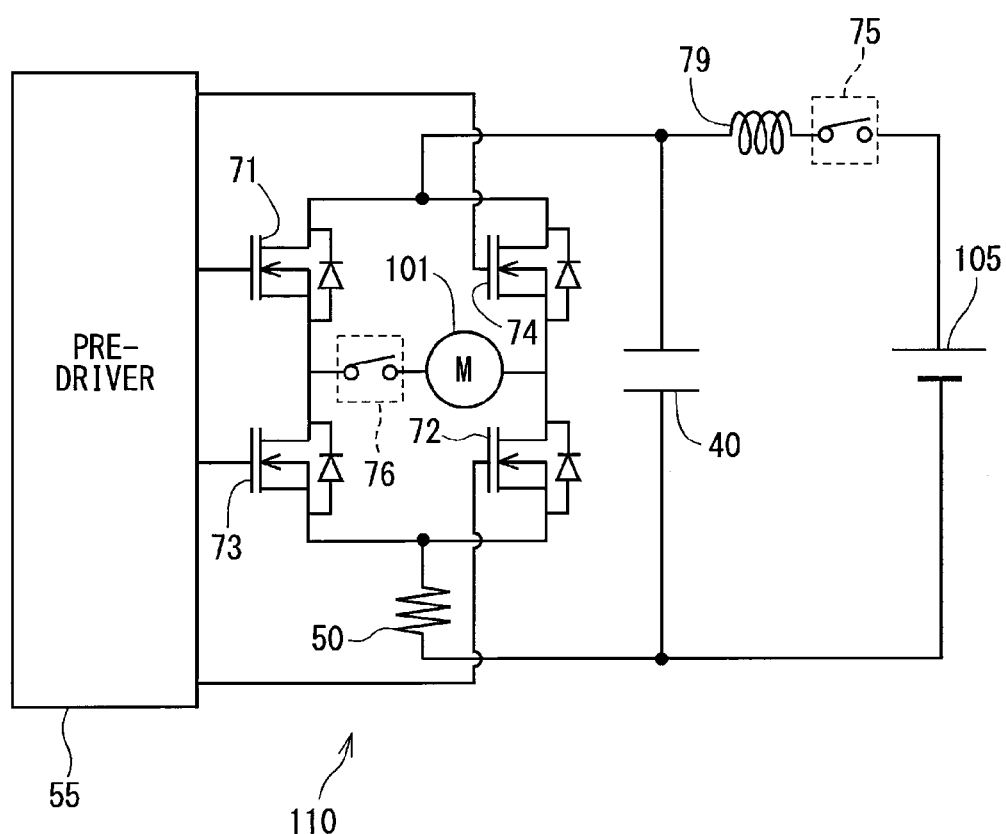
FIG. 2 is a diagram illustrating a circuit structure of an electric control unit according to the first embodiment of the present disclosure.
Figure 3:
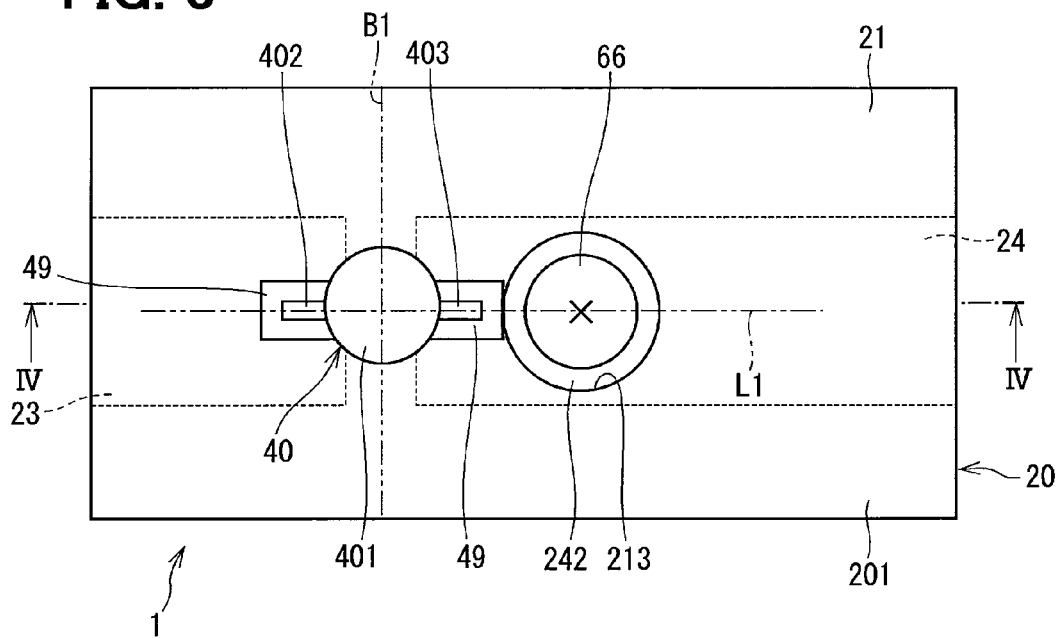
FIG. 3 is a diagram illustrating a plan view of the electric control unit according to the first embodiment of the present disclosure.
Figure 4:
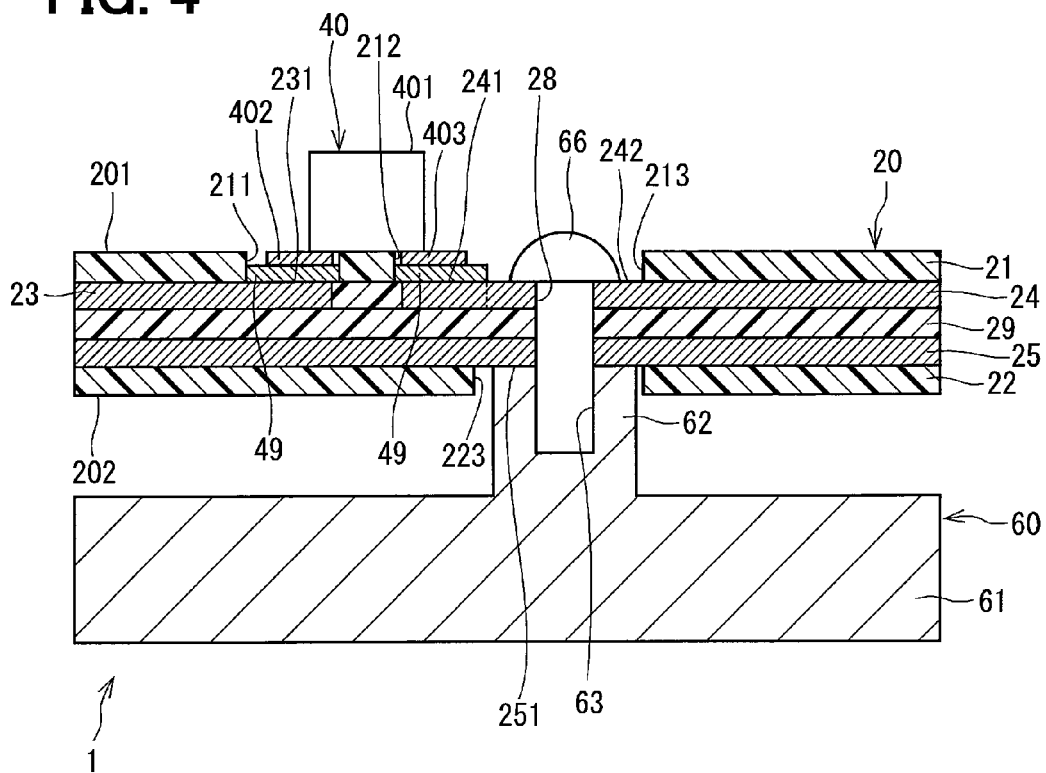
FIG. 4 is a diagram illustrating a cross-sectional view taken along line IV-IV in FIG. 3.

As shown in FIGS. 2-4, the electronic control unit 1 includes a board 20, a capacitor 40 as an electronic device, a heatsink 60 as a casing, a screw 66 as a fastener, and switching devices 71-74.

Firstly, a circuit structure of the electronic control unit 1 is described with reference to FIG. 2. It is noted that the components shown in FIG. 2 including the switching devices 71-74 and excluding the motor 101 and a battery 105 form the electronic control unit 1.

The switching devices 71-74 are field-effect transistors such as metal-oxide-semiconductor field-effect transistors (MOSFETs). The switching devices 71-74 are connected to form an H-bridge circuit and supply electric current to the motor 101 by switching electric current supplied from the battery 105. The switching devices 71-74 are switched ON and OFF in accordance with driving signals outputted from a pre-driver 55.

When a steering wheel 109 is turned to the right, two switching devices 71 and 72, which are symmetrically arranged with respect to the motor 101, are switched ON so that the motor 101 can be driven. At this time, the other two switching devices 73 and 74 are switched OFF.

When the steering wheel 109 is turned to the left, two switching devices 73 and 74, which are symmetrically arranged with respect to the motor 101, are switched ON so that the motor 101 can be driven. At this time, the other two switching devices 71 and 72 are turned OFF.

A power supply relay 75 is connected between the battery 105 and a coil 79. A motor relay 76 is connected between the motor 101 and a node between the switching devices 71 and 73.

A coil 79 is connected between the battery 105 and the H-bridge circuit, which is constructed with the switching devices 71-74, and reduces noise.

The capacitor 40 as an electronic device is connected in parallel with the battery 105 and stores charge. The capacitor 40 supplements power supply to the switching devices 71-74 and reduces noise components such as surge voltage.

A shunt resistor 50 as an electronic device is used to detect electric current supplied to the motor 101.

As shown in FIGS. 3 and 4, the board 20 is a printed circuit board such as a FR4 (Flame Retardant Type 4) made of a glass woven fabric with epoxy resin. The capacitor 40, the shunt resistor 50, the switching devices 71-74, the power supply relay 75, the motor relay 76, and the coil 79 are mounted on the board 20, and the board 20 is fixed to the heatsink 60. According to the first embodiment, the board 20 has a first surface 201 and a second surface 202 opposite to the first surface 201. The capacitor 40 is mounted on the first surface 201 and not mounted on the second surface 202. The heatsink 60 is located on the same side of the board 20 as the second surface 202. In other word, the heatsink 60 is located on the opposite side of the board 20 to the first surface 201. In FIGS. 3 and 4, for easy of understanding, illustration of the components except the capacitor 40 are omitted, and the board 20 is illustrated in a simplified manner.

The board 20 includes a first green mask 21 as a protection layer, a second green mask 22 as a protection layer, an anode pattern 23, a ground pattern 24, a conductor pattern 25, and an insulating layer 29.

The first green mask 21 is provided on the first surface 201 side. The second green mask 22 is provided on the second surface 202 side. The anode pattern 23 and the ground pattern 24 are provided inside the first green mask 21. The conductor pattern 25 is provided inside the second green mask 22.

The insulating layer 29 is interposed between the anode pattern 23 and the ground pattern 24, between the anode pattern 23 and the conductor pattern 25, and the ground pattern 24 and the conductor pattern 25.

An anode terminal contact hole 211 is formed in the first green mask 21 over the anode pattern 23 so that a portion of the anode pattern 23 can be exposed on the first surface 201 side through the anode terminal contact hole 211. The portion of the anode pattern 23 exposed through the anode terminal contact hole 211 is hereinafter referred to as the "anode terminal connection pattern 231". Likewise, a cathode terminal contact hole 212 is formed in the first green mask 21 over the ground pattern 24 so that a portion of the ground pattern 24 can be exposed on the first surface 201 side through the cathode terminal contact hole 212. The portion of the ground pattern 24 exposed through the cathode terminal contact hole 212 is hereinafter referred to as the "cathode terminal connection pattern 241".

In addition, a screw hole 213 is formed in the first green mask 21 over the ground pattern 24 so that a portion of the ground pattern 24 can be exposed on the first surface 201 side through the screw hole 213. The portion of the ground pattern 24 exposed through the screw hole 213 is hereinafter referred to as the "exposed ground pattern 242".

The anode terminal connection pattern 231 and the cathode terminal connection pattern 241 are substantially rectangular in plan view. The exposed ground pattern 242 is substantially circular in plan view.

Specifically, the cathode terminal connection pattern 241 and the exposed ground pattern 242 are formed as a continuous pattern. Further, a tangent to the exposed ground pattern 242 at a point where the cathode terminal connection pattern 241 and the exposed ground pattern 242 are in contact with each other is perpendicular to the long side of the cathode terminal connection pattern 241.

A screw hole 223 is formed in the second green mask 22 at a position corresponding to the screw hole 213 formed in the first green mask 21 so that a portion of the conductor pattern 25 can be exposed on the second surface 202 side through the screw hole 223. The portion of the conductor pattern 25 exposed through the screw hole 223 is hereinafter referred to as the "exposed conductor pattern 251". An insertion hole 28 penetrating the board 20 is formed in the exposed ground pattern 242 and the exposed conductor pattern 251. The screw 66 is inserted through the insertion hole 28.

The capacitor 40 includes a body 401, an anode terminal 402, and a cathode terminal 403.

For example, the body 401 has a substantially cylindrical shape. However, the body 401 can be any shape besides a cylindrical shape.

The anode terminal 402 projects from one end of the body 401 and is bent in a first direction. The anode terminal 402 is connected to the anode terminal connection pattern 231, which is exposed through the anode terminal contact hole 211, by a solder 49. Thus, the anode terminal 402 is electrically connected to the anode pattern 23.

The cathode terminal 403 projects from the same end of the body 401 as the anode terminal 402 and is bent in a second direction opposite to the first direction. That is, the anode terminal 402 and the cathode terminal 403 are bent in opposite directions.

The cathode terminal 403 is connected to the cathode terminal connection pattern 241, which is exposed through the cathode terminal contact hole 212, by another solder 49. Thus, the cathode terminal 403 is electrically connected to the ground pattern 24.

A straight line connecting the anode terminal 402 and the cathode terminal 403 under a condition where the capacitor 40 is mounted on the board 20 is hereinafter referred to as the "imaginary line L1". Also, a straight line normal to the imaginary line L1 and passing the center of the body 401 of the capacitor 40 is hereinafter referred to as the reference line B1. That is, the anode terminal 402 and the cathode terminal 403 are located on opposite sides of the body 401 with respect to the reference line B1. The side where the cathode terminal 403 is located with respect to the reference line B1 is hereinafter referred to as the "cathode terminal side of the capacitor 40".

The exposed ground pattern 242 is partially or entirely located on the cathode terminal side of the capacitor 40. In other word, the cathode terminal 403 of the capacitor 40 at least partially faces the exposed ground pattern 242. Further, the exposed ground pattern 242 is on the imaginary line L1.

When the capacitor 40 is mounted on the board 20, the anode terminal connection pattern 231 and the cathode terminal connection pattern 241 are covered with the solder 49. In contrast, the exposed ground pattern 24 remains exposed on the first surface 201 side even under the condition where the capacitor 40 is mounted on the board 20.

The heatsink 60 is made of metal with high heat conductivity such as aluminum. The heatsink 60 has a base portion 61 and a pillar portion 62. The heatsink 60 serves not only to dissipate heat but also to establish a ground.

The base portion 61 is substantially parallel to the board 20. The pillar portion 62 projects from the base portion 61 toward the board 20. The pillar portion 62 has a receiver hole 63 for receiving the screw 66.

The screw 66 is made of an electrically conducting material.

The board 20 and the heatsink 60 are positioned relative to each other so that the insertion hole 28 can be aligned with the receiver hole 63. The screw 66 is inserted through the insertion hole 28 and screwed into the receiver hole 63. Thus, the board 20 is fixed to the heatsink 60.

As mentioned previously, the insertion hole 28 is formed in the exposed ground pattern 242. Therefore, the ground pattern 24 is electrically connected to the heatsink 60 through the screw 66. Further, the cathode terminal 403 of the capacitor 40 is electrically connected to the heatsink 60 through the ground pattern 24 and the screw 66. Thus, the capacitor 40 is grounded to the heatsink 60, so that noise from the capacitor 40 is reduced.

Heat of the capacitor 40 is dissipated to the heatsink 60 through the ground pattern 24 and the screw 66.

In particular, since the cathode terminal contact hole 212 and the screw hole 213 are in contact with each other, a distance between the cathode terminal 403 and the screw 66 can be reduced so that a wiring resistance can be reduced. Thus, both noise reduction and heat dissipation can be achieved.

The insertion hole 28 penetrates the conductor pattern 25. In other word, the insulating layer 29 is not formed around the insertion hole 28 at a layer level of the conductor pattern 25. Therefore, the conductor pattern 25 is electrically connected to the ground pattern 24 through the screw 66 and thus serves as a ground pattern. Accordingly, the heat of the capacitor 40 is transmitted to the conductor pattern 25 through the screw 66.

Further, the exposed conductor pattern 251, which is the portion of the conductor pattern 25 exposed through the screw hole 223, is in contact with the pillar portion 62 of the heatsink 60. Thus, the heat transmitted to the conductor pattern 25 can be highly efficiently dissipated to the heatsink 60 side.

In this way, the heat of the capacitor 40 can be dissipated more highly efficiently.

The first embodiment can be summarized as follows. The electronic control apparatus 1 includes the board 20, the capacitor 40, the heatsink 60, and the screw 66.

The board 20 includes the first green mask 21 and the ground pattern 24 which is partially exposed, as the exposed ground pattern 242, outside the first green mask 21.

The capacitor 40 is mounted on the board 20 and includes the anode terminal 402 and the cathode terminal 403 which is connected to the ground pattern 24.

The heatsink 60 supports the board 20.

The screw 66 is inserted through the insertion hole 28 formed in the exposed ground pattern 242, thereby electrically connecting the ground pattern 24 to the heatsink 60 and fixing the board 20 to the heatsink 60.

The capacitor 40, which is an electronic device needed to be grounded to reduce its noise, is connected through the ground pattern 24 and the screw 66 to the heatsink 60 serving as a ground. Thus, the noise of the capacitor 40 can be reduced.

The exposed ground pattern 242 is located on the cathode terminal side of the capacitor 40. In other word, the cathode terminal 403 of the capacitor 40 faces the exposed ground pattern 242. Accordingly, a wiring resistance is reduced, so that the noise of the capacitor 40 is highly efficiently reduced. Thus, the noise of the capacitor 40 can be reduced without additional metal components or wires, and a mount area of the board 20 can be used effectively. Therefore, the board 20 and, by extension, the electronic control unit 1 can be reduced in size.

Further, since the heat generated in the capacitor 40 is highly dissipated to the heatsink 60 through the ground pattern 24 and the screw 66, a reduction in capacitance of the capacitor 40 due to the heat generation is reduced. For this reason, a capacitor having a small capacitance can be employed as the capacitor 40. In addition, a life of the capacitor 40 can be increased.

The ground pattern 24 has the cathode terminal connection pattern 241 which is exposed outside the first green mask 21 and connected to the cathode terminal 403. The cathode terminal connection pattern 241 and the exposed ground pattern 242 are formed as a continuous pattern. The cathode terminal connection pattern 241 is located on the imaginary line L1 which connects the anode terminal 402 and the cathode terminal 403.

Thus, a distance between the capacitor 40 and the exposed ground pattern 242 can be reduced so that a wiring resistance can be reduced. Accordingly, the noise of the capacitor 40 can be reduced more highly efficiently. In addition, the heat of the capacitor 40 can be highly efficiently dissipated.

The electronic control unit 1 includes the switching devices 71-74 which are mounted on the board 20.

The electronic control unit 1 is used in the electronic power steering apparatus 110. The electronic power steering apparatus 110 includes the electronic control unit 1 and the motor 101. The motor 101 is driven and controlled in accordance with the ON and OFF switching of the switching devices 71-74 and produces assisting-torque to help a driver to steer the vehicle.

Since the board 20 can be reduced in size as described above, the electronic control unit 1 as a whole can be reduced in size accordingly. In addition, since the noise of the capacitor 40 is reduced, the electronic power steering apparatus 110 can be controlled accurately.

(Second Embodiment)

Figure 5:
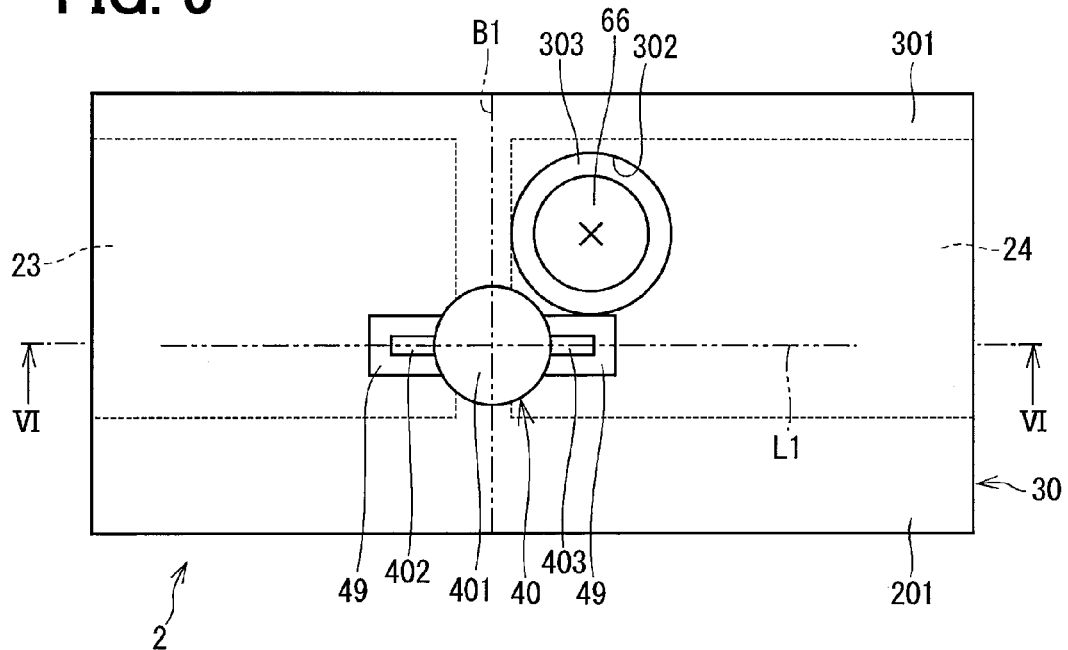
FIG. 5 is a diagram illustrating a plan view of an electric control unit according to a second embodiment of the present disclosure.
Figure 6:
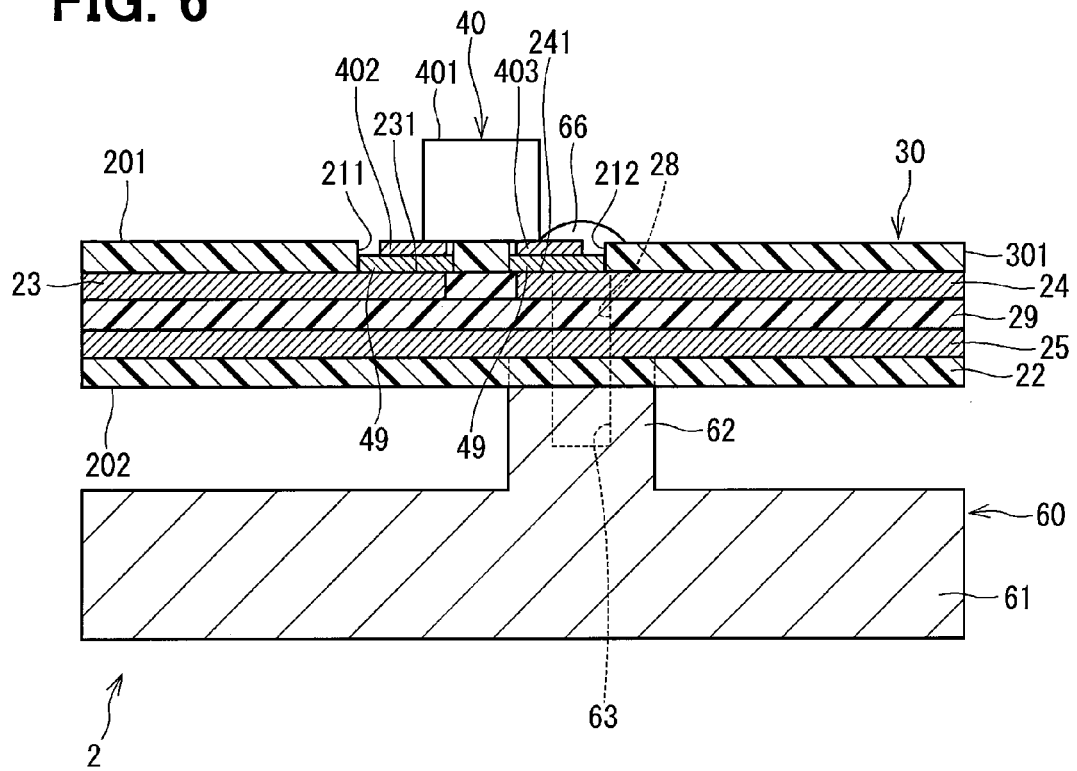
FIG. 6 is a diagram illustrating a cross-sectional view taken along line VI-VI in FIG. 5.

An electronic control unit 2 according to a second embodiment of the present embodiment is described below with reference to FIGS. 5 and 6. The second embodiment is similar to, but differs from the first embodiment as follows.

The electronic control unit 2 includes a board 30 instead of the board 20. A screw hole 302 formed in a first green mask 301 of the board 30 is different from the screw hole 213 formed in the first green mask 21 of the board 20.

A portion of the ground pattern 24 is exposed on the first surface 201 side through the screw hole 302. The portion of the ground pattern 24 exposed through the screw hole 302 is hereinafter referred to as the "exposed ground pattern 303". The exposed ground pattern 303 is substantially circular in plan view. The cathode terminal connection pattern 241 and the exposed ground pattern 303 are formed as a continuous pattern. Further, a tangent to the exposed ground pattern 303 at a point where the cathode terminal connection pattern 241 and the exposed ground pattern 303 are in contact with each other is substantially parallel to the long side of the cathode terminal connection pattern 241.

The insertion hole 28 through which the screw 66 is inserted is formed in the exposed ground pattern 303.

As described above, according to the second embodiment, the cathode terminal connection pattern 241 and the exposed ground pattern 303 are in contact with each other. Further, the exposed ground pattern 303 is located on the cathode terminal side of the capacitor 40 and is not located on the imaginary line L1.

Even in the structure described above, the same advantage as obtained in the first embodiment can be obtained.

(Third Embodiment)

Figure 7:
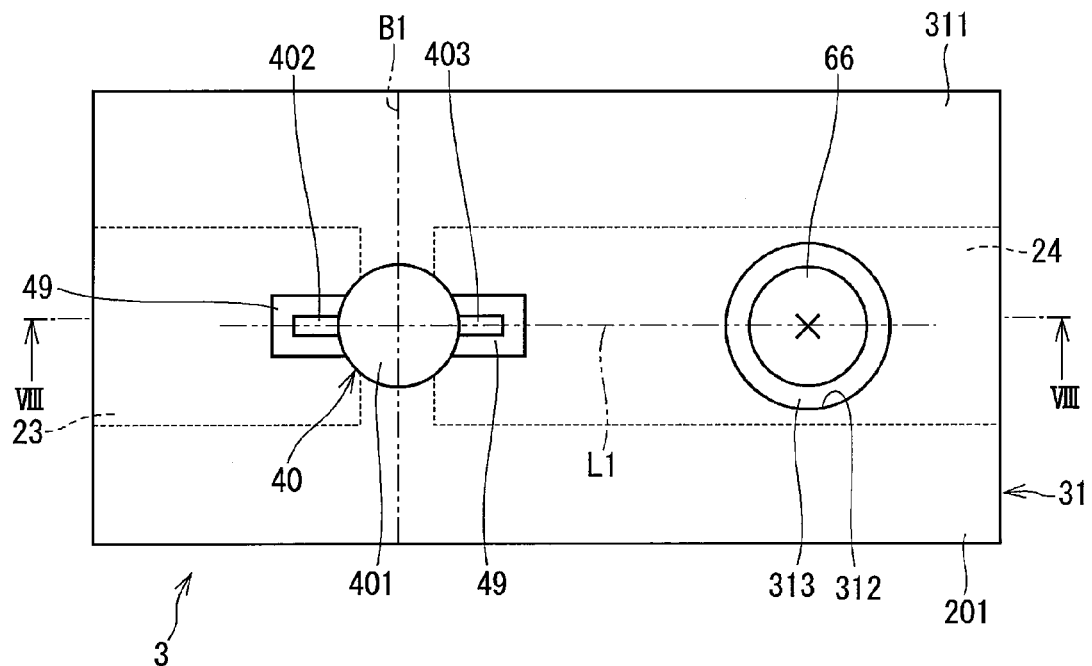
FIG. 7 is a diagram illustrating a plan view of an electric control unit according to a third embodiment of the present disclosure.
Figure 8:
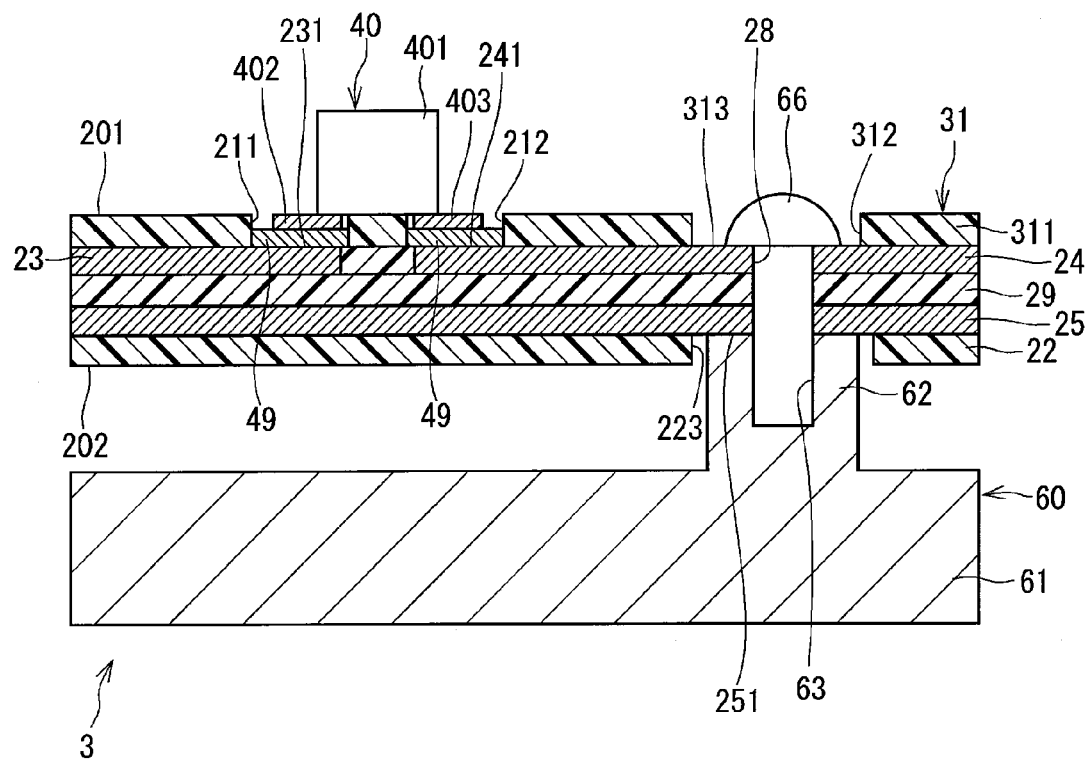
FIG. 8 is a diagram illustrating a cross-sectional view taken along line VIII-VIII in FIG. 7.

An electronic control unit 3 according to a third embodiment of the present embodiment is described below with reference to FIGS. 7 and 8. The second embodiment is similar to, but differs from the first embodiment as follows.

The electronic control unit 3 includes a board 31 instead of the board 20. A screw hole 312 formed in a first green mask 311 of the board 31 is different from the screw hole 213 formed in the first green mask 21 of the board 20.

A portion of the ground pattern 24 is exposed on the first surface 201 side through the screw hole 312. The portion of the ground pattern 24 exposed through the screw hole 312 is hereinafter referred to as the "exposed ground pattern 313". The exposed ground pattern 313 is substantially circular in plan view. The first green mask 311 is located between the cathode terminal connection pattern 241 and the exposed ground pattern 313. That is, the cathode terminal connection pattern 241 and the exposed ground pattern 313 are separated from each other by the first green mask 311.

The insertion hole 28 through which the screw 66 is inserted is formed in the exposed ground pattern 313.

As described above, according to the third embodiment, the cathode terminal connection pattern 241 and the exposed ground pattern 313 are separated from each other by the first green mask 311. Further, the exposed ground pattern 313 is located on the cathode terminal side of the capacitor 40 and located on the imaginary line L1. Thus, flexibility in arrangement of the capacitor 40 and the screw 66 can be increased.

In addition, the same advantage as obtained in the first embodiment can be obtained.

(Fourth Embodiment)

Figure 9:
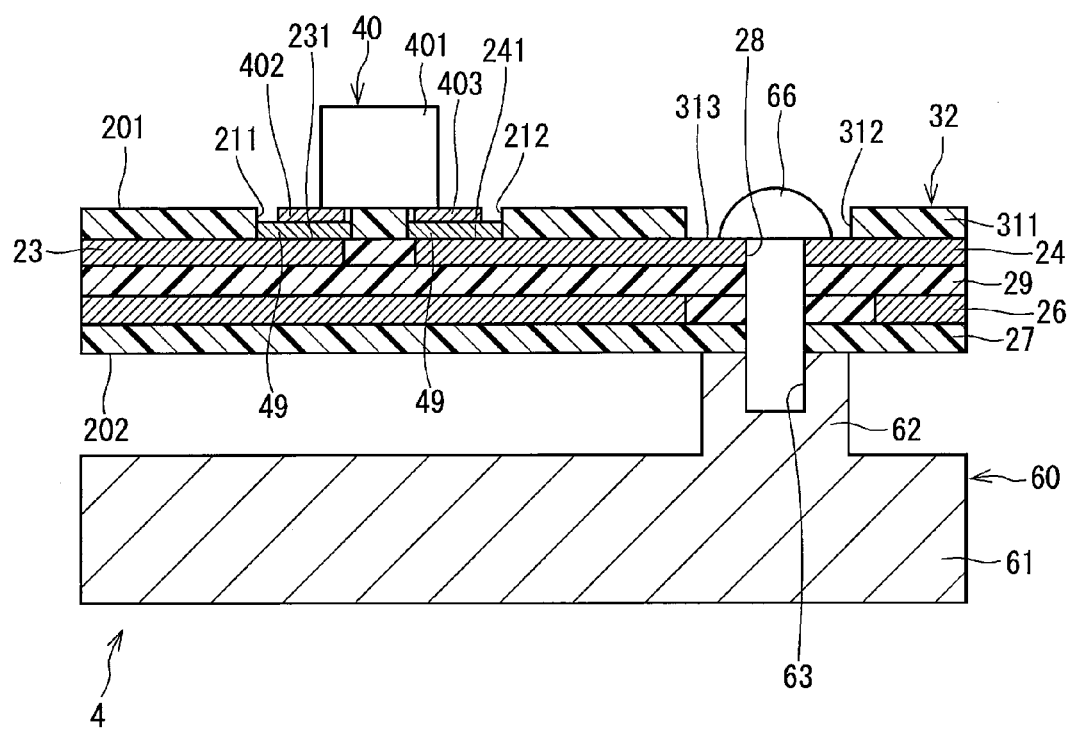
FIG. 9 is a diagram illustrating a cross-sectional view of an electric control unit according to a fourth embodiment of the present disclosure.

An electronic control unit 4 according to a fourth embodiment of the present embodiment is described below with reference to FIG. 9. FIG. 9 corresponds to FIG. 8. The fourth embodiment is similar to, but differs from the third embodiment as follows.

The electronic control unit 4 includes a board 32 instead of the board 31. In the board 32, the insulating layer 29 is provided between the insertion hole 28 and a conductor pattern 26, and no screw hole is formed in a second green mask 27 so that the conductor pattern 26 cannot be exposed on the second surface 202 side. Thus, the screw 66 does not electrically connect the conductor pattern 26 to the ground pattern 24 and the heatsink 60. Therefore, the conductor pattern 26 can be used as wires other than a ground pattern. Accordingly, flexibility in wiring of the board 32 can be increased.

In addition, the same advantage as obtained in the third embodiment can be obtained.

(Fifth Embodiment)

Figure 10:
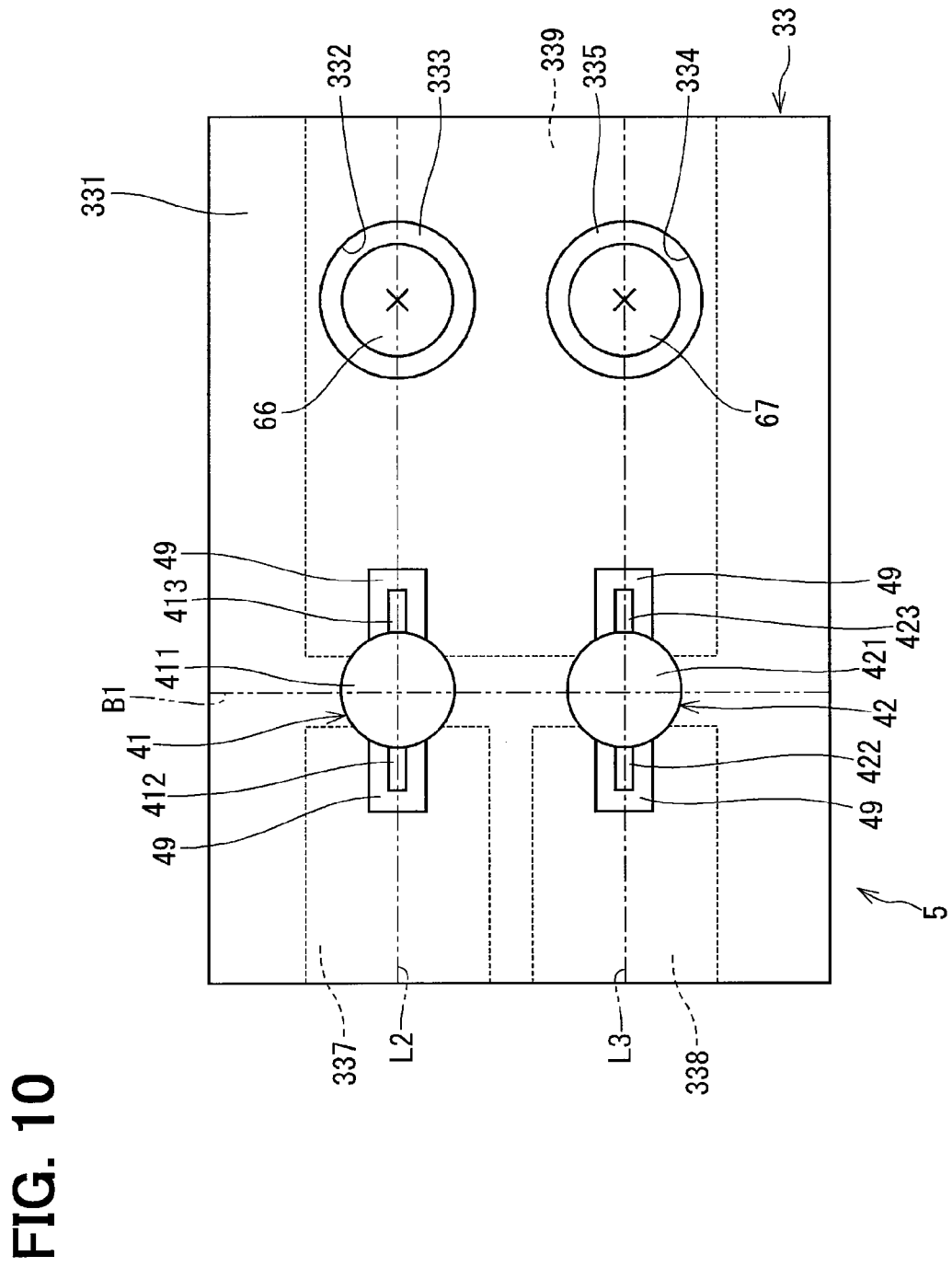
FIG. 10 is a diagram illustrating a plan view of an electric control unit according to a fifth embodiment of the present disclosure.

An electronic control unit 5 according to a fifth embodiment of the present embodiment is described below with reference to FIG. 10.

A board 33 of the electronic control unit 5 includes a first green mask 331, anode patterns 337 and 338, a ground pattern 339, a second green mask (not shown), a conductor pattern (not shown), and an insulating layer (not shown). Two capacitors 41 and 42 are mounted in the board 33.

The capacitor 41 includes a body 411, an anode terminal 412, and a cathode terminal 413. The capacitor 42 includes a body 421, an anode terminal 422, and a cathode terminal 423. Each of the capacitors 41 and 42 is identical in structure with the capacitor 40.

The anode terminal 412 of the capacitor 41 is connected to the anode pattern 337. The anode terminal 422 of the capacitor 42 is connected to the anode pattern 338. The cathode terminal 413 of the capacitor 41 and the cathode terminal 423 of the capacitor 42 are connected to the ground pattern 339.

A straight line connecting the anode terminal 412 and the cathode terminal 413 of the capacitor 41 is hereinafter referred to as the "imaginary line L2". A straight line connecting the anode terminal 422 and the cathode terminal 423 of the capacitor 42 is hereinafter referred to as the "imaginary line L3". A normal to each of the imaginary lines L2 and L3 coincides with the reference line B1.

Two screw holes 332 and 334 are formed in the first green mask 331. A portion of the ground pattern 339 is exposed outside the first green mask 331 through the screw hole 332. The portion of the ground pattern 339 exposed through the screw hole 332 is hereinafter referred to as the "exposed ground pattern 333". A portion of the ground pattern 339 is exposed outside the first green mask 331 through the screw hole 334. The portion of the ground pattern 339 exposed through the screw hole 334 is hereinafter referred to as the "exposed ground pattern 335".

An insertion hole (not shown) penetrating the board 33 is formed in the exposed ground pattern 333, and the screw 66 is inserted through the insertion hole. Another hole (not shown) penetrating the board 33 is formed in the exposed ground pattern 335, and a screw 67 as a fastener is inserted through the other insertion hole. Like the screw 66, the screw 67 is screwed into a receiver hole of the heatsink 60.

A positional relationship between the capacitor 41, the exposed ground pattern 333, and the screw 66 is the same as that described in the third embodiment. That is, the exposed ground pattern 333 is located on the cathode terminal side of the capacitor 41 and located on the imaginary line L2 which connects the anode terminal 412 and the cathode terminal 413. The first green mask 331 is provided between the exposed ground pattern 333 and a cathode terminal connection pattern to which the cathode terminal 413 is connected. Thus, the exposed ground pattern 333 and the cathode terminal connection pattern are separated from each other.

A positional relationship between the capacitor 42, the exposed ground pattern 335, and the screw 67 is the same as that described in the third embodiment. That is, the exposed ground pattern 335 is located on the cathode terminal side of the capacitor 42 and located on the imaginary line L3 which connects the anode terminal 422 and the cathode terminal 423. The first green mask 331 is provided between the exposed ground pattern 335 and another cathode terminal connection pattern to which the cathode terminal 423 is connected. Thus, the exposed ground pattern 335 and the other cathode terminal connection pattern are separated from each other.

In this way, the number of the capacitors 41 and 42 is equal to the number of the screws 66 and 67 so that the capacitors 41 and 42 can be respectively provided with the screws 66 and 67.

The cathode terminal 413 of the capacitor 41 is connected to the heatsink 60 through the ground pattern 339 and the screws 66 and 67. Likewise, the cathode terminal 423 of the capacitor 42 is connected to the heatsink 60 through the ground pattern 339 and the screws 66 and 67.

As described above, according to the fifth embodiment, the cathode terminal 413 of the capacitor 41 and the cathode terminal 423 of the capacitor 42 are connected to the same ground pattern 339. Thus, noise sources capable of generating noise are consolidated. Therefore, the number of locations needed to be provided with measures against noise can be reduced, and a mount area of the board 33 can be used effectively.

Further, one capacitor 41 is provided with one screw 66, and one capacitor 42 is provided with one screw 67. Thus, noise of each of the capacitors 41 and 42 can be highly efficiently reduced, and heat of each of the capacitors 41 and 42 can be highly efficiently dissipated.

In addition, the same advantage as obtained in the preceding embodiments can be obtained.

(Sixth Embodiment)

Figure 11:
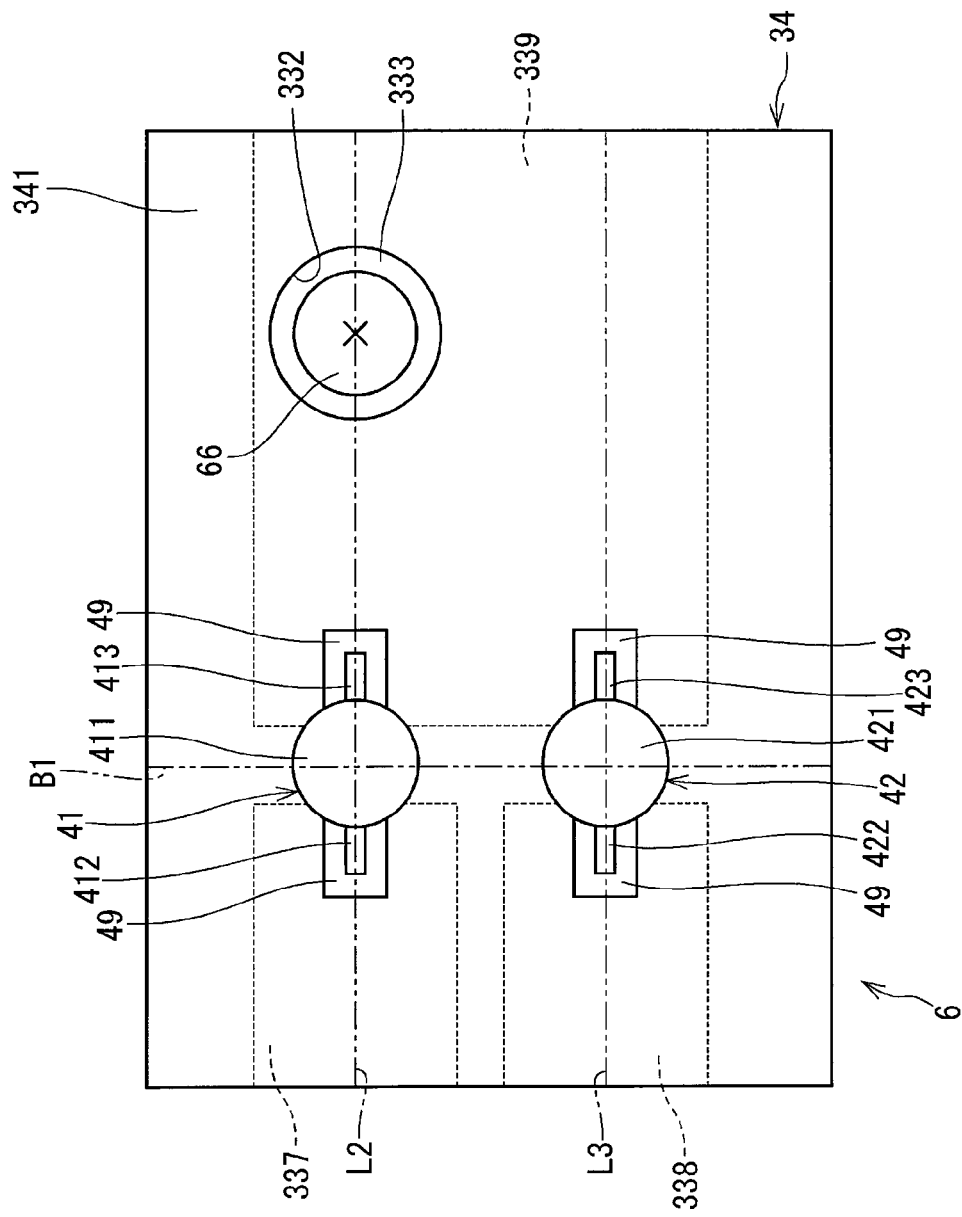
FIG. 11 is a diagram illustrating a plan view of an electric control unit according to a sixth embodiment of the present disclosure.

An electronic control unit 6 according to a sixth embodiment of the present embodiment is described below with reference to FIG. 11.

The sixth embodiment is similar to, but differs from the fifth embodiment as follows. In a board 34 of the electronic control unit 6, the screw hole 334 is not formed in a first green mask 341. Accordingly, in the board 34, the exposed ground pattern 335 exposed through the screw hole 334 is not formed, and the screw 67 is not used.

That is, one screw 66 is shared between two capacitors 41 and 42. The screw 66 is located on the imaginary line L2 which connects the anode terminal 412 and the cathode terminal 413 of the capacitor 41 and misaligned with the imaginary line L3 which connects the anode terminal 422 and the cathode terminal 423 of the capacitor 42.

As described above, according to the sixth embodiment, the cathode terminal 413 of the capacitor 41 and the cathode terminal 423 of the capacitor 42 are connected to the same ground pattern 339. Thus, noise sources capable of generating noise are consolidated. Therefore, the number of locations needed to be provided with measures against noise can be reduced, and a mount area of the board 34 can be used effectively. Further, since one screw 66 is shared between two capacitors 41 and 42, the number of parts in the electronic control unit 6 can be reduced.

Furthermore, a distance between the cathode terminal 413 of the capacitor 41 and the screw 66 is smaller than a distance between the cathode terminal 423 of the capacitor 42 and the screw 66. Thus, the noise of the capacitor 41 can be more efficiently reduced than the noise of the capacitor 42.

In addition, the same advantage as obtained in the preceding embodiments can be obtained.

(Seventh Embodiment)

Figure 12:
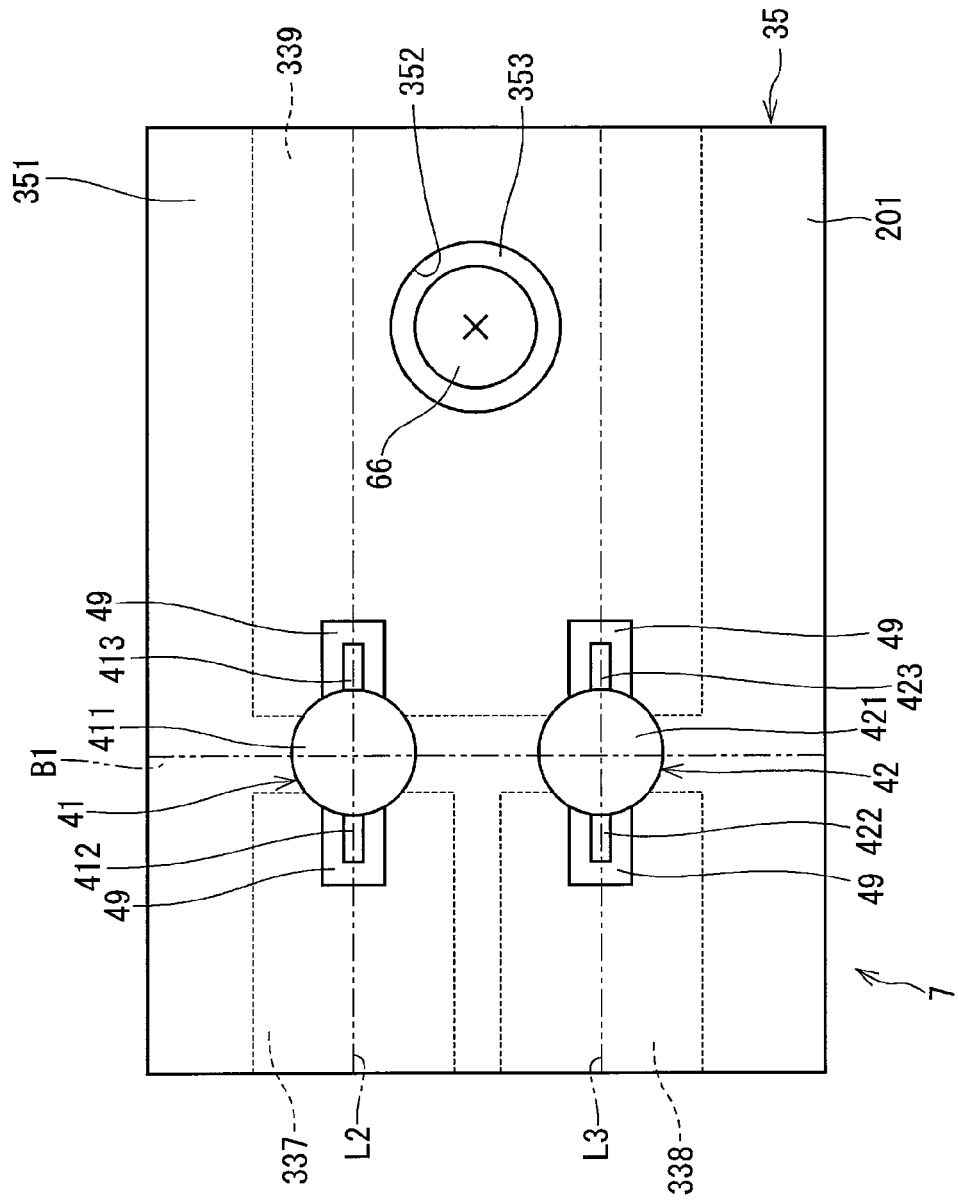
FIG. 12 is a diagram illustrating a plan view of an electric control unit according to a seventh embodiment of the present disclosure.

An electronic control unit 7 according to a seventh embodiment of the present embodiment is described below with reference to FIG. 12.

The seventh embodiment is similar to, but differs from the sixth embodiment as follows.

The electronic control unit 7 includes a board 35 instead of the board 34. A screw hole 352 formed in a first green mask 351 of the board 35 is different from the screw hole 332 formed in the first green mask 341 of the board 34.

The screw hole 352 is located between the imaginary line L2 which connects the anode terminal 412 and the cathode terminal 413 of the capacitor 41 and the imaginary line L3 which connects the anode terminal 422 and the cathode terminal 423 of the capacitor 42. A portion of the ground pattern 339 is exposed outside the first green mask 351 through the screw hole 352. The portion of the ground pattern 339 exposed through the screw hole 352 is hereinafter referred to as the "exposed ground pattern 353". An insertion hole (not shown) penetrating the board 35 is formed in the exposed ground pattern 353, and the screw 66 is inserted through the insertion hole.

A distance between the cathode terminal 413 of the capacitor 41 and the screw 66 is equal to a distance between the cathode terminal 423 of the capacitor 42 and the screw 66. Thus, the noise of the capacitors 41 and 42 can be reduced equally. In addition, the same advantage as obtained in the preceding embodiments can be obtained.

(Eighth Embodiment)

Figure 13:
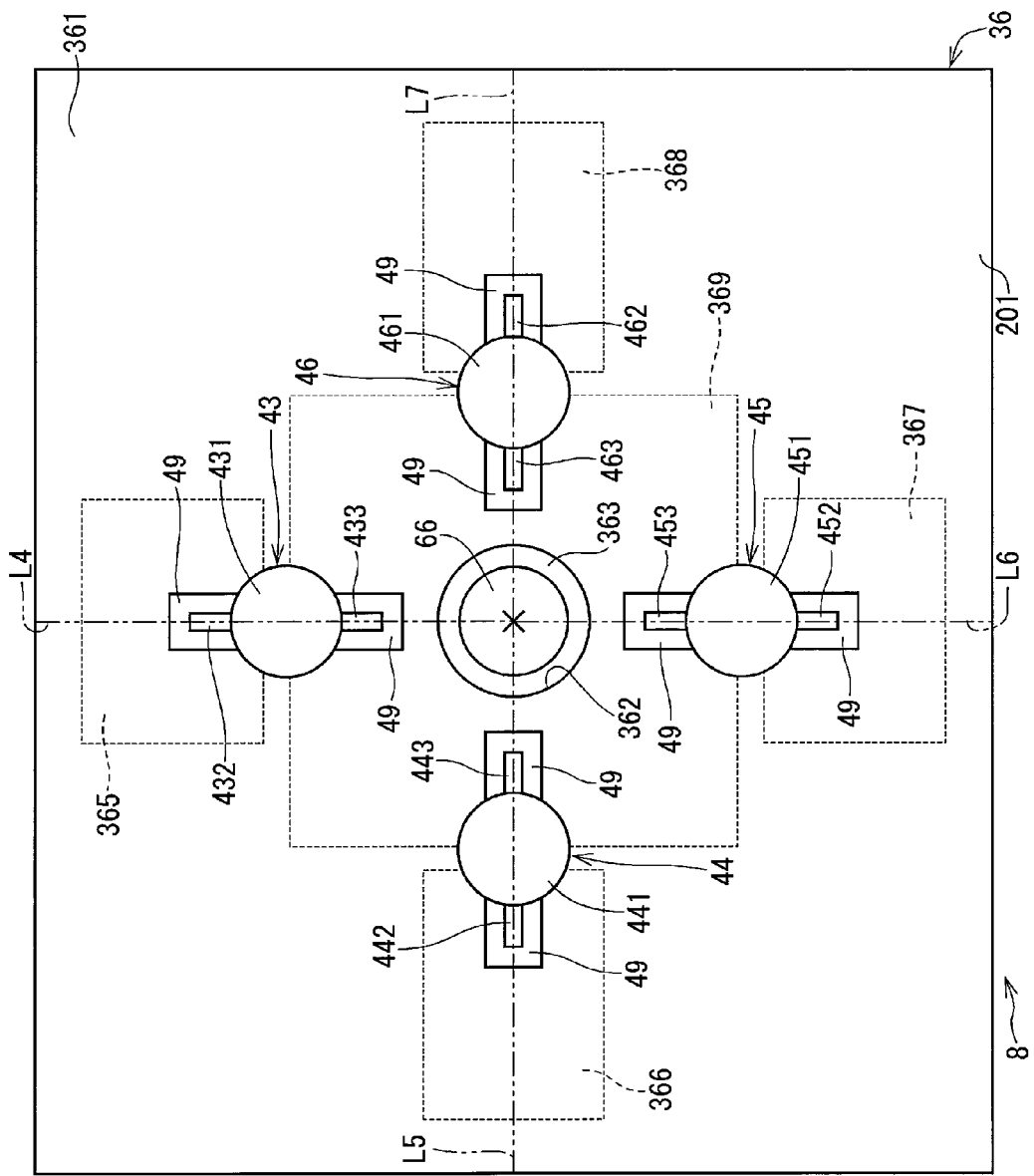
FIG. 13 is a diagram illustrating a plan view of an electric control unit according to an eighth embodiment of the present disclosure.

An electronic control unit 8 according to an eighth embodiment of the present embodiment is described below with reference to FIG. 13.

A board 36 of the electronic control unit 8 includes a first green mask 361, anode patterns 365, 366, 367, and 368, a ground pattern 369, a second green mask (not shown), a conductor pattern (not shown), and an insulating layer (not shown). Four capacitors 43-46 are mounted in the board 36. As shown in FIG. 13, the anode patterns 365, 366, 367, and 368 are located outside the ground pattern 369.

The capacitor 43 includes a body 431, an anode terminal 432, and a cathode terminal 433. The capacitor 44 includes a body 441, an anode terminal 442, and a cathode terminal 443. The capacitor 45 includes a body 451, an anode terminal 452, and a cathode terminal 453. The capacitor 46 includes a body 461, an anode terminal 462, and a cathode terminal 463. Each of the capacitors 43-46 is identical in structure with the capacitor 40.

The anode terminal 432 of the capacitor 43 is connected to the anode pattern 365. The anode terminal 442 of the capacitor 44 is connected to the anode pattern 366. The anode terminal 452 of the capacitor 45 is connected to the anode pattern 367. The anode terminal 462 of the capacitor 46 is connected to the anode pattern 368.

The cathode terminal 433 of the capacitor 43, the cathode terminal 443 of the capacitor 44, the cathode terminal 453 of the capacitor 45, and the cathode terminal 463 of the capacitor 46 are connected to the ground pattern 369.

A screw hole 362 is formed in the first green mask 361. A portion of the ground pattern 369 is exposed outside the first green mask 361 through the screw hole 362. The portion of the ground pattern 369 exposed through the screw hole 362 is hereinafter referred to as the "exposed ground pattern 363".

Like in the third embodiment, the first green mask 361 is provided between the exposed ground pattern 363 and a cathode terminal connection pattern to which the cathode terminals 433, 443, 453, and 463 are connected. Thus, the exposed ground pattern 363 and the cathode terminal connection pattern are separated from each other.

An insertion hole (not shown) penetrating the board 36 is formed in the exposed ground pattern 363, and the screw 66 is inserted through the insertion hole. The screw 66 is screwed into the receiver hole 63 of the heatsink 60.

The screw 66 is located on an imaginary line L4 which connects the anode terminal 432 and the cathode terminal 433 of the capacitor 43. Likewise, the screw 66 is located on an imaginary line L5 which connects the anode terminal 442 and the cathode terminal 443 of the capacitor 44. Further, the screw 66 is located on an imaginary line L6 which connects the anode terminal 452 and the cathode terminal 453 of the capacitor 45. Furthermore, the screw 66 is located on an imaginary line L7 which connects the anode terminal 462 and the cathode terminal 463 of the capacitor 46. It is noted that illustration of reference lines normal to the imaginary lines L4-L7 are omitted in FIG. 13 for the sake of simplicity.

The capacitors 43-46 are arranged radially around the center of the screw 66. Thus, one screw 66 can be shared between multiple capacitors 43-46.

The cathode terminals 433, 443, 453, and 463 of the capacitors 43, 44, 45, and 46 are connected to the same ground pattern 369, and the ground pattern 369 is electrically connected to the heatsink 60 through the screw 66. Thus, noise of the capacitors 43-46 can be reduced. Further, since noise sources capable of generating noise are consolidated, the number of locations needed to be provided with measures against noise can be reduced. Therefore, a mount area of the board 36 can be used effectively. Likewise, heat of the capacitors 43-46 gathers, the heat can be efficiently dissipated to the heatsink 60.

A distance between the cathode terminal 433 of the capacitor 43 and the screw 66, a distance between the cathode terminal 443 of the capacitor 44 and the screw 66, a distance between the cathode terminal 453 of the capacitor 45 and the screw 66, a distance between the cathode terminal 463 of the capacitor 46 and the screw 66 are equal to one another. Thus, the noise of the capacitors 43-46 can be reduced equally, and the heat of the capacitors 43-46 can be dissipated equally.

In addition, the same advantage as obtained in the preceding embodiments can be obtained.

(Ninth Embodiment)

Figure 14:
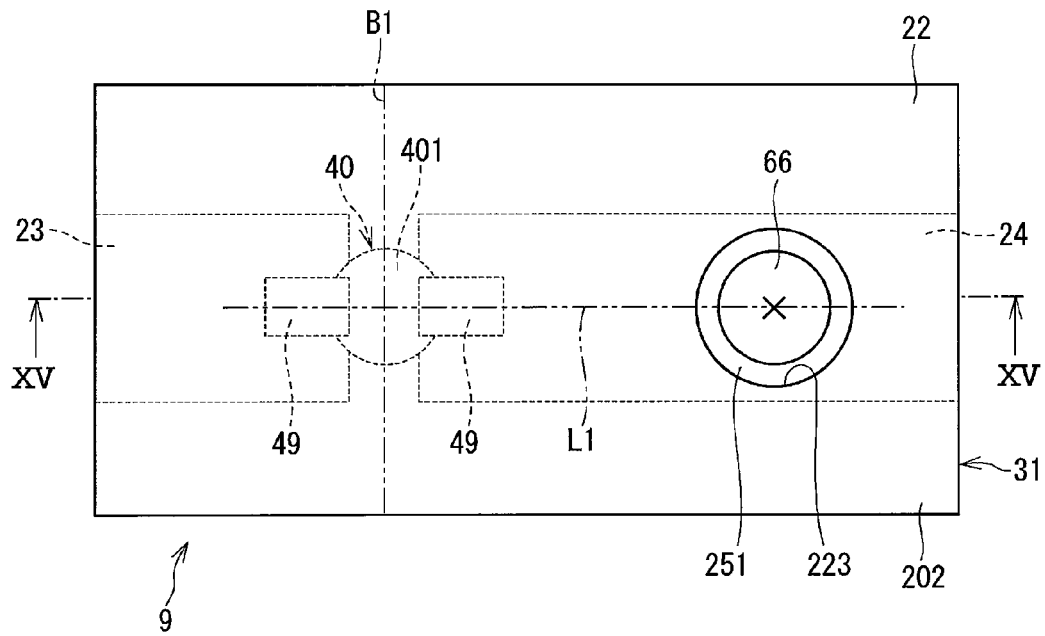
FIG. 14 is a diagram illustrating a plan view of an electric control unit according to a ninth embodiment of the present disclosure.
Figure 15:
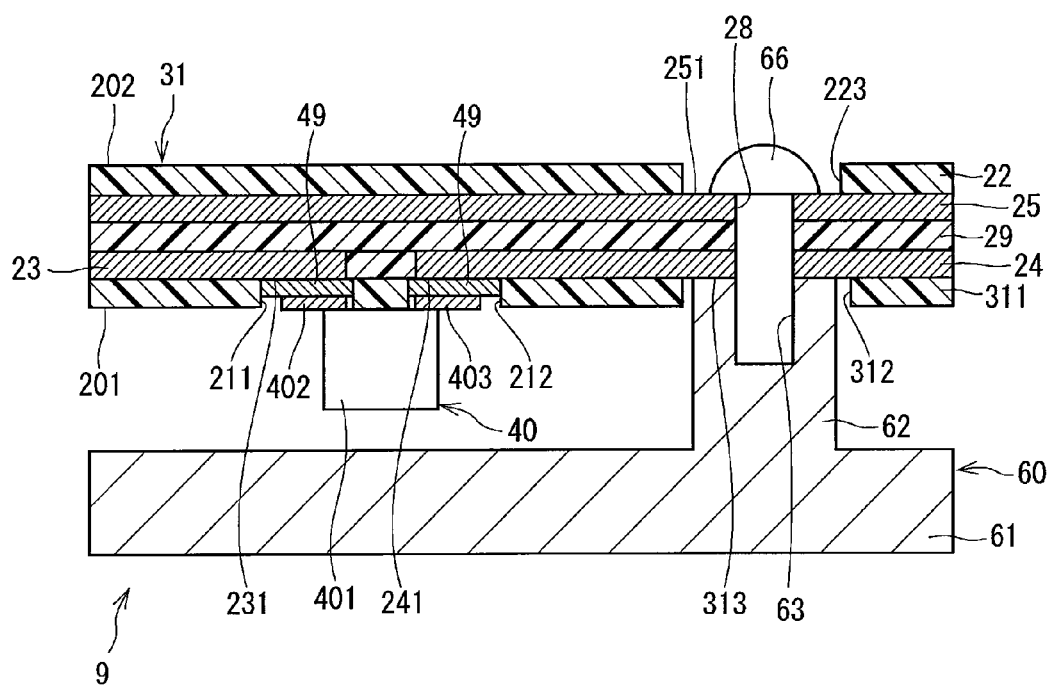
FIG. 15 is a diagram illustrating a cross-sectional view taken along line XV-XV in FIG. 14.

An electronic control unit 9 according to a ninth embodiment of the present embodiment is described below with reference to FIGS. 14 and 15.

The ninth embodiment is similar to, but differs from the third embodiment in that the heatsink 60 is located on the first surface 201 side of the board 31. That is, in the electronic control unit 9 according to the ninth embodiment, the heatsink 60 is located on the same surface side of the board 31 as the capacitor 40.

When the screw 66 is screwed into the receiver hole 63 of the heatsink 60, the exposed ground pattern 313 is in contact with the pillar portion 62 of the heatsink 60 by screw pressure so that the ground pattern 24 and the heatsink 60 can be electrically connected. Accordingly, the cathode terminal 403 of the capacitor 40 is electrically connected to the heatsink 60 through the ground pattern 24. Thus, noise of the capacitor 40 can be reduced, and heat of the capacitor 40 can be dissipated to the heatsink 60.

Therefore, the same advantage as obtained in the preceding embodiments can be obtained.

(Tenth Embodiment)

Figure 16:
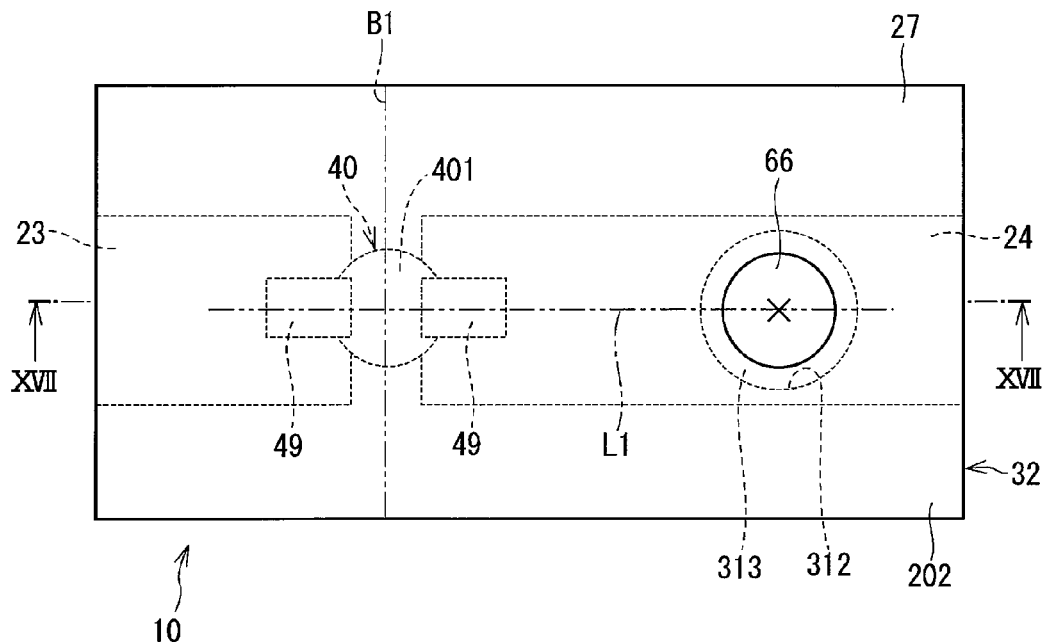
FIG. 16 is a diagram illustrating a plan view of an electric control unit according to a tenth embodiment of the present disclosure.
Figure 17:
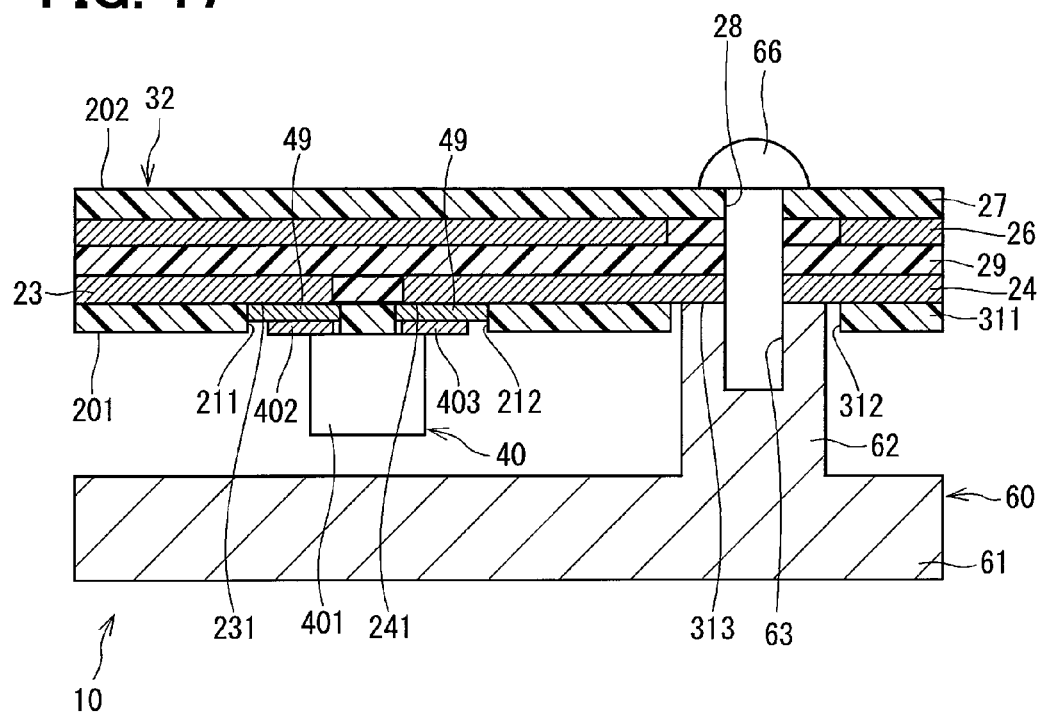
FIG. 17 is a diagram illustrating a cross-sectional view taken along line XVII-XVII in FIG. 16.

An electronic control unit 10 according to a tenth embodiment of the present embodiment is described below with reference to FIGS. 16 and 17.

The tenth embodiment is similar to, but differs from the fourth embodiment in that the heatsink 60 is located on the first surface 201 side of the board 32. That is, in the electronic control unit 10 according to the tenth embodiment, the heatsink 60 is located on the same surface side of the board 31 as the capacitor 40. It is noted that a head of the screw 66 is located on the second green mask 27.

Even in the structure described above, the same advantage as obtained in the preceding embodiments can be obtained.

(Eleventh Embodiment)

Figure 18:
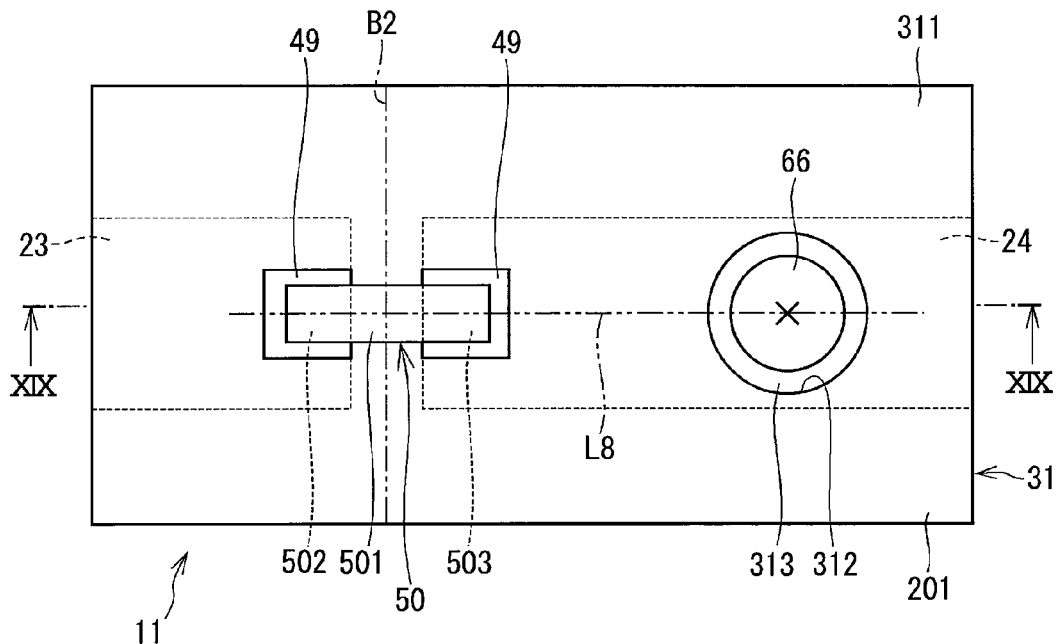
FIG. 18 is a diagram illustrating a plan view of an electric control unit according to an eleventh embodiment of the present disclosure.
Figure 19:
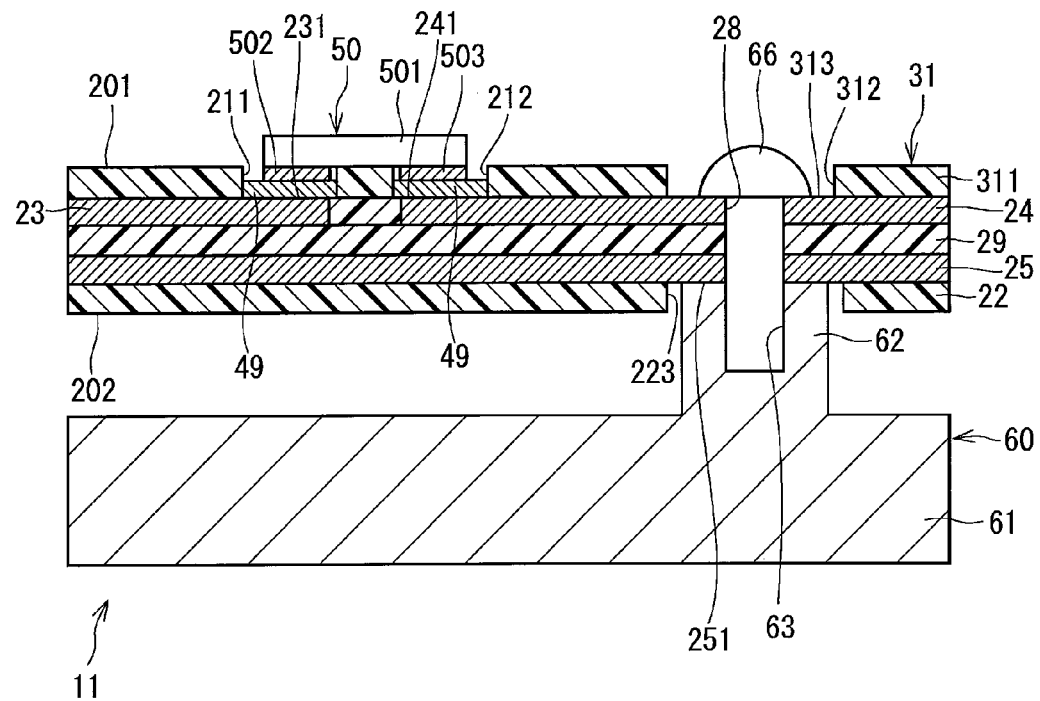
FIG. 19 is a diagram illustrating a cross-sectional view taken along line XIX-XIX in FIG. 18.

An electronic control unit 11 according to an eleventh embodiment of the present embodiment is described below with reference to FIGS. 18 and 19.

The eleventh embodiment is similar to, but differs from the third embodiment in that an electronic device mounted on the board 31 is the shunt resistor 50 instead of the capacitor 40.

The shunt resistor 50 includes a resistive portion 501, an anode terminal 502, and a cathode terminal 503. The screw 66 is located on an imaginary line L8 which connects the anode terminal 502 and the cathode terminal 503. A straight line normal to the imaginary line L8 and passing the center of the resistive portion 501 is hereinafter referred to as the "reference line B2". That is, the anode terminal 502 and the cathode terminal 503 are located on opposite sides of the resistive portion 501 with respect to the reference line B2. The side where the cathode terminal 503 is located with respect to the reference line B2 is hereinafter referred to as the "cathode terminal side of the shunt resistor 50". The exposed ground pattern 313 and the screw 66 are located on the cathode terminal side of the shunt resistor 50.

The anode terminal 502 is connected to the anode terminal connection pattern 231 by the solder 49. Thus, the anode terminal 502 is electrically connected to the anode pattern 23.

The cathode terminal 503 is connected to the cathode terminal connection pattern 241 by the other solder 49. Thus, the cathode terminal 503 is electrically connected to the ground pattern 24.

As described above, according to the eleventh embodiment, the shunt resistor 50, which is an electronic device needed to be grounded to reduce its noise, is connected through the ground pattern 24 and the screw 66 to the heatsink 60 serving as a ground. Thus, the noise of the shunt resistor 50 can be reduced. Accordingly, electric current supplied to the motor 101 can be detected accurately so that the electronic power steering apparatus 110 can be controlled accurately.

Further, heat of the shunt resistor 50 can be dissipated to the heatsink 60 through the ground pattern 24 and the screw 66.

Even in the structure described above, the same advantage as obtained in the preceding embodiments can be obtained.

(Twelfth Embodiment)

Figure 20:
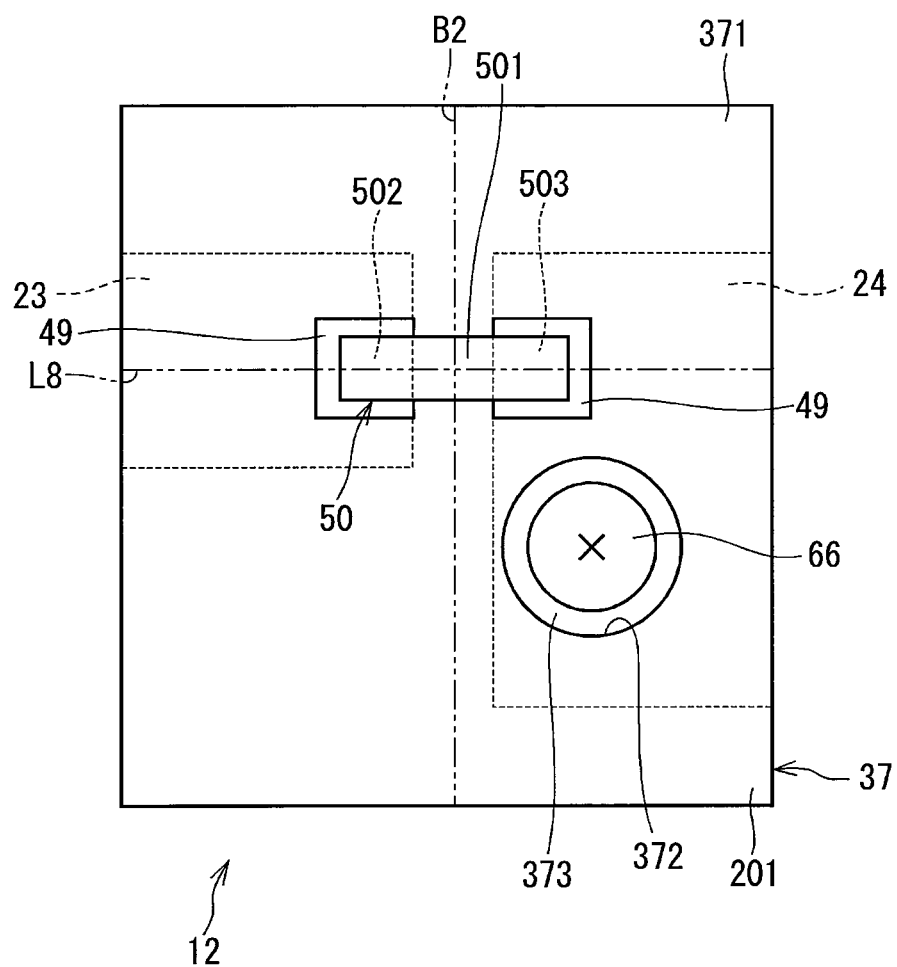
FIG. 20 is a diagram illustrating a plan view of an electric control unit according to a twelfth embodiment of the present disclosure.

An electronic control unit 12 according to a twelfth embodiment of the present embodiment is described below with reference to FIG. 20.

The twelfth embodiment is similar to, but differs from the eleventh embodiment as follows.

The electronic control unit 12 includes a board 37 instead of the board 31. A screw hole 372 formed in a first green mask 371 of the board 37 is different from the screw hole 312 formed in the first green mask 311 of the board 31.

A portion of the ground pattern 24 is exposed outside the first green mask 371 through the screw hole 372. The portion of the ground pattern 24 exposed through the screw hole 372 is circular in plan view and hereinafter referred to as the "exposed ground pattern 373". The first green mask 371 is provided between the exposed ground pattern 373 and the cathode terminal connection pattern 241 (not shown) so that the exposed ground pattern 373 and the cathode terminal connection pattern 241 can be separated from each other.

The insertion hole 28 (not shown) is formed in the exposed ground pattern 373, and the screw 66 is inserted through the insertion hole 28.

The exposed ground pattern 373 is misaligned with the imaginary line L8 which connects the anode terminal 502 and the cathode terminal 503 of the shunt resistor 50.

Even in the structure described above, the same advantage as obtained in the preceding embodiments can be obtained.

(Thirteenth Embodiment)

Figure 21:
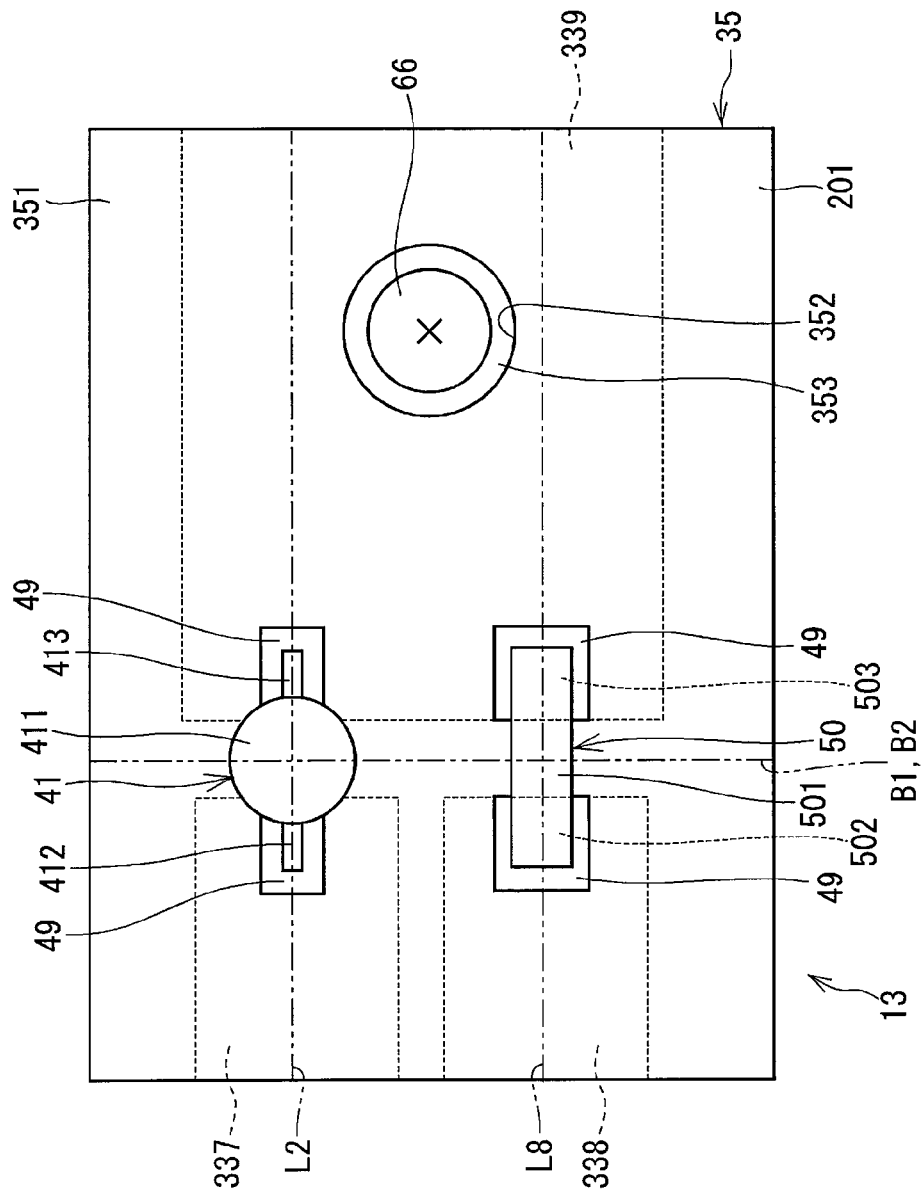
FIG. 21 is a diagram illustrating a plan view of an electric control unit according to a thirteenth embodiment of the present disclosure.

An electronic control unit 13 according to a thirteenth embodiment of the present embodiment is described below with reference to FIG. 21.

The thirteenth embodiment is similar to, but differs from the seventh embodiment in that the shunt resistor 50 instead of the capacitor 42 is mounted on the board 35.

The exposed ground pattern 353 and the screw 66 are located on the cathode terminal side of the shunt resistor 50 and located between the imaginary line L2 which connects the anode terminal 412 and the cathode terminal 413 of the capacitor 41 and the imaginary line L8 which connects the anode terminal 502 and the cathode terminal 503 of the shunt resistor 50.

A distance between the cathode terminal 413 of the capacitor 41 and the screw 66 is equal to a distance between the cathode terminal 503 of the shunt resistor 50 and the screw 66. Thus, the noise of the capacitor 41 and the shunt resistor 50 can be reduced equally.

Alternatively, the exposed ground pattern 353 and the screw 66 can be located so that the distance between the screw 66 and one of the capacitor 41 and the shunt resistor 50 can be smaller than the distance between the screw 66 and the other of the capacitor 41 and the shunt resistor 50. In such an approach, the noise of the one of the capacitor 41 and the shunt resistor 50 can be more efficiently reduced than the noise of the other of the capacitor 41 and the shunt resistor 50.

As described above, according to the thirteenth embodiment, the cathode terminals 413 and 503 of the capacitor 41 and the shunt resister 50 as electronic devices of different types are connected to the same ground pattern 339. The capacitor 41 and the shunt resistor 50 are connected to the heatsink 60 through the ground pattern 339 and the screw 66. Thus, the noise of the capacitor 41 and the shunt resistor 50 can be reduced, and the heat of the capacitor 41 and the shunt resistor 50 can be dissipated.

In this way, noise of electronic devices of different types can be reduced. Further, since electronic devices of different types capable of generating noise are connected to the same ground pattern 339, noise sources are consolidated. Therefore, the number of locations needed to be provided with measures against noise can be reduced.

In addition, the same advantage as obtained in the preceding embodiments can be obtained.

(Fourteenth Embodiment)

Figure 22:
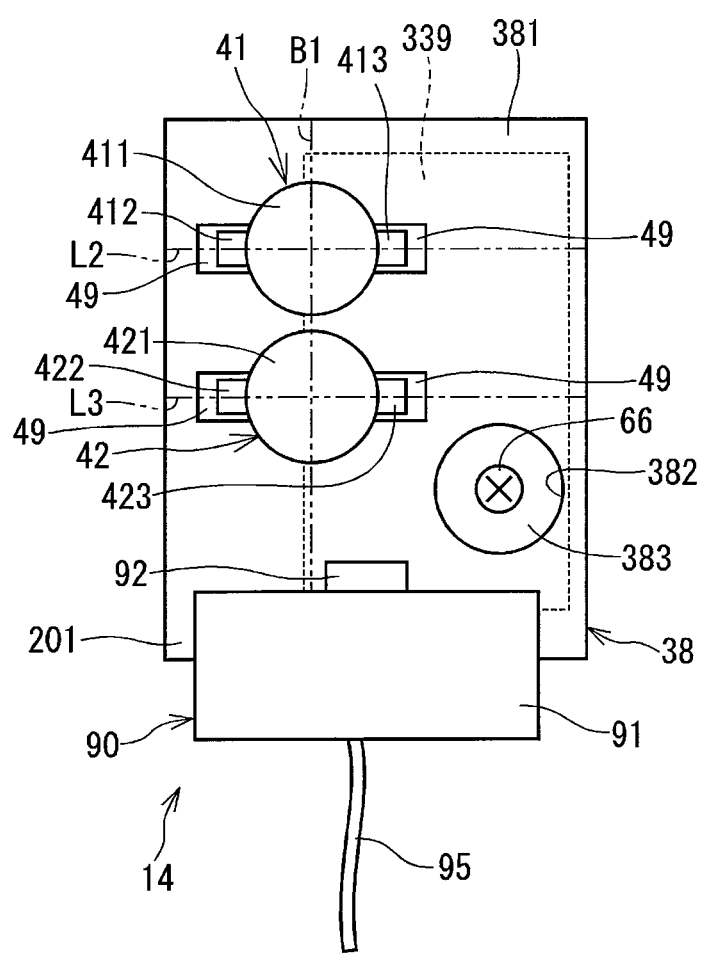
FIG. 22 is a diagram illustrating a plan view of an electric control unit according to a fourteenth embodiment of the present disclosure.

An electronic control unit 14 according to a fourteenth embodiment of the present embodiment is described below with reference to FIG. 22.

The fourteenth embodiment is similar to, but differs from the seventh embodiment as follows. It is noted that illustration of an anode pattern is omitted in FIG. 22 for the sake of simplicity.

A connector 90 is mounted on a board 38 of the electronic control unit 14. The connector 90 includes a connector body 91 and a ground terminal 92. The connector body 91 is located along one side of the board 38. A ground harness 95 to be connected to a negative terminal of the battery 105 (refer to FIG. 1) is connected to the connector body 91. The ground terminal 92 is electrically connected to the ground harness 95. Further, the ground terminal 92 is connected to the ground pattern 339 by a solder or the like.

A screw hole 382 is formed in a first green mask 381 of the board 38. A portion of the ground pattern 339 is exposed outside the first green mask 381 through the screw hole 382. The portion of the ground pattern 339 exposed through the screw hole 382 is hereinafter referred to as the "exposed ground pattern 383". An insertion hole (not shown) penetrating the board 38 is formed in the exposed ground pattern 383, and the screw 66 is inserted through the insertion hole.

The exposed ground pattern 383 is located on the cathode terminal side of the capacitor 41 and located between the connector 90 and the imaginary line L2 which connects the anode terminal 412 and the cathode terminal 413 of the capacitor 41.

Further, the exposed ground pattern 383 is located between the connector 90 and the imaginary line L3 which connects the anode terminal 422 and the cathode terminal 423 of the capacitor 42. A distance between the cathode terminal 423 of the capacitor 42 and the screw 66 is equal to a distance between the ground terminal 92 of the connector 90 and the screw 66. Thus, the noise of the capacitor 42 and external noise from the connector 90 can be reduced equally. Alternatively, the distance between the cathode terminal 423 of the capacitor 42 and the screw 66 can be different from the distance between the ground terminal 92 of the connector 90 and the screw 66.

As described above, according to the fourteenth embodiment, the electronic control unit 14 further includes the connector 90 which has the ground terminal 92 connected to the ground pattern 339.

The exposed ground pattern 383 is located between the connector 90 and the imaginary line L2. Further, the exposed ground pattern 383 is located between the connector 90 and the imaginary line L3.

The cathode terminal 413 of the capacitor 41, the cathode terminal 423 of the capacitor 42, and the ground terminal 92 of the connector 90 are connected to the same ground pattern 339, and the ground pattern 339 is connected to the heatsink 60 through the screw 66. Thus, not only the noise of the capacitors 41 and 42 but also the external noise from the connector 90 can be reduced.

(Modifications)

While the present disclosure has been described with reference to the embodiments, it is to be understood that the disclosure is not limited to the embodiments. The present disclosure is intended to cover various modifications and equivalent arrangements within the spirit and scope of the present disclosure. For example, the embodiments can be modified as follows.

In the embodiments, the anode terminal connection pattern and the cathode terminal connection pattern are substantially rectangular in plan view, and the exposed ground pattern is substantially circular in plan view. Alternatively, the anode terminal connection pattern, the cathode terminal connection pattern, and the exposed ground pattern can be any shape. Further, the exposed ground pattern can be located at any position as long as it is located on the cathode terminal side of the electronic device.

In the embodiments, the anode terminal of the electronic device is connected to the anode terminal pattern directly below the protection layer. Alternatively, the anode terminal of the electronic device is connected to the anode terminal pattern formed in an inner layer.

In the embodiments, the protection layer is a green mask. It is not always necessary that the protection layer is a green mask as long as the protection layer can electrically isolate the wiring patterns from each other.

In the embodiments, each exposed ground pattern is provided with one fastener. Alternatively, each exposed ground pattern can be provided with multiple fasteners.

In the embodiments, each fastener is provided with one, two, or four electronic devices. Alternatively, each fastener can be provided with any number of electronic devices.

In the eighth embodiment, multiple electronic devices are arranged radially with respect to the fastener, and in the fifth, sixth, seventh, thirteenth, and fourteenth embodiments, multiple electronic devices have the same reference lines. Alternatively, the electronic devices can be arranged in any way as long as the exposed ground pattern and the fastener are located on the cathode terminal side of the electronic devices.

In the fourteenth embodiment, the connector is mounted on the board where two capacitors are mounted. The connector can be mounted on the board of any other embodiment. Further, as long as the ground terminal of the connector and the cathode terminal of the electronic device are connected to the same ground pattern, it is not always necessary that the exposed ground pattern and the fastener are located between the connector and the imaginary line which connects the anode terminal and the cathode terminal of the electronic device.

In the embodiments, the electronic device is a capacitor or a shunt resistor. Alternatively, the electronic device can be any device as long as it needs to be grounded to reduce its noise. For example, the capacitor and the shunt resister in the embodiments can be replaced with each other.

In the embodiments, each of the power supply relay and the motor relay is a mechanical relay. Alternatively, at least one of the power supply relay and the motor relay can be a semiconductor relay.

In the embodiments, a driving circuit to drive the motor is an H-bridge circuit. Alternatively, the driving circuit can be a three-phase inverter or the like.

In the embodiments, the electronic control unit is used in a so-called rack-assist type electric power steering apparatus in which the assisting-torque of the motor is outputted to a rack shaft. Alternatively, the electronic control unit can be used in a column-assist type electric power steering apparatus or the like in which the assisting-torque of the motor is outputted to a portion other than a rack shaft. Further, the electronic control unit can be used in an apparatus other than an electric power steering apparatus.

Such changes and modifications are to be understood as being within the scope of the present disclosure as defined by the appended claims.

What is claimed is:

1. An electronic control unit comprising:
    a board including a protection layer and a ground pattern covered with the protection layer, the ground pattern having an exposed portion exposed outside the protection layer;
    a first electronic device mounted on the board and having a first anode terminal, the first electronic device further having a first cathode terminal;
    a second electronic device mounted on the board and having a second anode terminal, the second electronic device further having a second cathode terminal;
    a heatsink supporting the board, and
    a fastener inserted through an insertion hole of the exposed portion, the fastener electrically connecting the ground pattern to the heatsink while fixing the board to the heatsink, wherein
    the exposed portion is located on the cathode terminal sides of the first and second electronic devices, and
    the first cathode terminal and the second cathode terminal are commonly connected to the ground pattern,
    the fastener is used for the first electronic device and the second electronic device,
    the first cathode terminal and the second cathode terminal are directed to the fastener, and
    the fastener is located between a first imaginary line, which connects the first anode terminal and second the cathode terminal and the first cathode terminal, and a second imaginary line, which connects the second anode terminal and the second cathode terminal.

2. The electronic control unit according to claim 1, wherein
    the ground pattern further has a cathode terminal connection pattern exposed outside the protection layer and connected to the first and second cathode terminals, and
    the cathode terminal connection pattern and the exposed portion are continuous with each other.

3. The electronic control unit according to claim 1, wherein
    the ground pattern further has a cathode terminal connection pattern exposed outside the protection layer and connected to the first and second cathode terminals, and
    the cathode terminal connection pattern and the exposed portion are spaced from each other by the protection layer.

4. The electronic control unit according to claim 1, wherein
    the exposed portion is located on at least the first or second imaginary line.

5. The electronic control unit according to claim 1, wherein
    the exposed portion is not located on either the first or second imaginary line.

6. The electronic control unit according to claim 5, further comprising:
    a connector having a ground terminal connected to the ground pattern, wherein
    the exposed portion is located between the connector and the first imaginary line.

7. The electronic control unit according to claim 1, wherein a distance between the first cathode terminal and the fastener is equal to a distance between the second cathode terminal and the fastener.

8. The electronic control unit according to claim 1, wherein
    a distance between the first cathode terminal and the fastener is smaller than a distance between the second cathode terminal and the fastener.

9. The electronic control unit according to claim 1, wherein
the fastener is one of a plurality of fasteners, and
each of the first and second electronic devices is arranged with respect to a corresponding one of the plurality of fasteners.

10. The electronic control unit according to claim 1, wherein
each of the first and second electronic devices is a capacitor or a shunt resistor.

11. The electronic control unit according to claim 1, further comprising:
a switching device mounted on the board.

12. An electric power steering apparatus for a vehicle comprising:
an electronic control unit as defined in claim 11, and
a rotating electrical machine configured to produce assisting-torque to help a driver to steer the vehicle, wherein
the rotating electrical machine is controlled by switching ON and OFF the switching device.

13. The electronic control unit according to claim 1, wherein the fastener is a singular component.

* * * * *